(12) United States Patent
Andrews et al.

(10) Patent No.: US 12,278,219 B2
(45) Date of Patent: Apr. 15, 2025

(54) LED CHIPS AND DEVICES WITH TEXTURED LIGHT-EXTRACTING PORTIONS, AND FABRICATION METHODS

(71) Applicant: CreeLED, Inc., Durham, NC (US)

(72) Inventors: Peter Scott Andrews, Durham, NC (US); David Suich, Durham, NC (US); Kevin Haberern, Cary, NC (US); Justin White, Morrisville, NC (US)

(73) Assignee: CreeLED, Inc., Durham, NC (US)

( * ) Notice: Subject to any disclaimer, the term of this patent is extended or adjusted under 35 U.S.C. 154(b) by 544 days.

(21) Appl. No.: 17/538,078

(22) Filed: Nov. 30, 2021

(65) Prior Publication Data

US 2022/0199589 A1 Jun. 23, 2022

Related U.S. Application Data

(60) Provisional application No. 63/128,691, filed on Dec. 21, 2020.

(51) Int. Cl.
*H01L 25/075* (2006.01)
*H01L 33/00* (2010.01)
*H01L 33/50* (2010.01)

(52) U.S. Cl.
CPC ........ *H01L 25/0753* (2013.01); *H01L 33/005* (2013.01); *H01L 33/502* (2013.01)

(58) Field of Classification Search
CPC . H01L 25/0753; H01L 33/005; H01L 33/502; H01L 33/20; H01L 33/0066; H01L 33/387; H01L 33/486; H01L 2933/0058; H01L 33/58; H01L 33/22; H01L 33/405; H01L 33/46; H01L 33/007; H01L 33/145; H01L 33/32; H01L 2224/48091; H01L 2924/00; H01L 2924/00014; H01L 33/10;
(Continued)

(56) References Cited

U.S. PATENT DOCUMENTS 7,939,841 B2 5/2011 Lee et al.
8,410,679 B2 4/2013 Ibbetson et al.
(Continued)

FOREIGN PATENT DOCUMENTS

WO 2020137470 A1 7/2020

OTHER PUBLICATIONS

Notice of Allowance for Taiwanese Patent Application No. 111129553, mailed Jan. 3, 2024, 3 pages.
(Continued)

*Primary Examiner* — Jonathan Han
(74) *Attorney, Agent, or Firm* — Withrow + Terranova, PLLC; Vincent K. Gustafson

(57) ABSTRACT

Pixelated-LED chips include substrate sidewalls with sidewall involutions and/or increased sidewall surface area regions to affect light extraction therefrom. A LED lighting device incorporates a superstrate that supports lumiphoric material and includes sidewalls with sidewall involutions and/or increased sidewall surface area regions. Methods for fabricating sidewall features may include etching (e.g., deep etching) of substrate or superstrate materials, such as by using an etch mask having edges with non-linear shapes to produce and/or enhance sidewall involutions when an etchant is supplied through the etch mask to selectively consume substrate or superstrate material.

22 Claims, 22 Drawing Sheets

(58) Field of Classification Search
CPC ....... H01L 33/38; H01L 33/382; H01L 33/42;
H01L 2224/45144; H01L 2224/8592;
H01L 2924/00012; H01L 2924/181;
H01L 2933/0016; H01L 2933/0083;
H01L 33/0095; H01L 33/02; H01L
33/025; H01L 33/12; H01L 33/24; H01L
33/30; H01L 33/40; H01L 33/44; H01L
33/501; H01L 33/60; H01L 33/641; H01L
33/644; H01L 2224/16225; H01L
2224/49107; H01L 24/73; H01L 25/167;
H01L 2924/0002; H01L 2924/01322;
H01L 2924/12041; H01L 2924/12042;
H01L 2924/1815; H01L 2933/0008;
H01L 2933/0025; H01L 33/0025; H01L
33/0075; H01L 33/06; H01L 33/14; H01L
33/26; H01L 33/305; H01L 33/505; H01L
33/56; H01L 33/62
See application file for complete search history.

(56) References Cited

U.S. PATENT DOCUMENTS

| | | | |
|---|---|---|---|
| 8,425,271 | B2 | 4/2013 | Hussell et al. |
| 9,000,466 | B1* | 4/2015 | Aldaz ................ H01L 33/0075 |
| | | | 257/E33.001 |
| 2003/0062529 | A1 | 4/2003 | Kato et al. |
| 2008/0237629 | A1 | 10/2008 | Ando et al. |
| 2011/0284894 | A1* | 11/2011 | Beom ................ H01L 33/20 |
| | | | 257/E33.006 |
| 2013/0049015 | A1 | 2/2013 | Fang et al. |
| 2015/0034963 | A1 | 2/2015 | Kinouchi et al. |
| 2015/0060913 | A1 | 3/2015 | Tsou et al. |
| 2015/0102432 | A1* | 4/2015 | Hsieh ................ B81B 7/0025 |
| | | | 257/415 |
| 2017/0040492 | A1* | 2/2017 | Chiu ................ H01L 33/10 |
| 2017/0098746 | A1 | 4/2017 | Bergmann et al. |
| 2017/0294417 | A1 | 10/2017 | Edmond et al. |
| 2019/0189846 | A1* | 6/2019 | Park ................ H01L 33/145 |
| 2020/0203419 | A1 | 6/2020 | Andrews et al. |
| 2021/0408328 | A1 | 12/2021 | Andrews |
| 2022/0131048 | A1 | 4/2022 | Andrews |

OTHER PUBLICATIONS

Notice of Allowance for U.S. Appl. No. 17/396,160, mailed Sep. 6, 2023, 7 pages.
Author Unknown, "DOWSIL JCR 6140 Optical Encapsulant," Technical Data Sheet, Form No. 11-3323-01 A, 2018, The Dow Chemical Company, 4 pages.
International Search Report and Written Opinion for International Patent Application No. PCT/US2022/074572, mailed Nov. 30, 2022, 12 pages.
Non-Final Office Action for U.S. Appl. No. 17/396,160, mailed Dec. 8, 2022, 12 pages.
Preliminary Examination Report for Taiwanese Patent Application No. 111129553, mailed May 11, 2023, 25 pages.
Final Office Action for U.S. Appl. No. 17/396,160, mailed May 26, 2023, 14 pages.
Advisory Action for U.S. Appl. No. 17/396,160, mailed Jul. 31, 2023, 3 pages.

* cited by examiner

LED CHIPS AND DEVICES WITH TEXTURED LIGHT-EXTRACTING PORTIONS, AND FABRICATION METHODS

STATEMENT OF RELATED APPLICATION(S)

This application claims priority to U.S. Provisional Patent Application No. 63/128,691 filed on Dec. 21, 2020, wherein the entire contents of the foregoing application are hereby incorporated by reference herein. This application additionally includes subject matter relating to the disclosure of U.S. patent application Ser. No. 17/078,733 filed on Oct. 23, 2020, now U.S. Pat. No. 11,437,548, wherein the entire contents of the foregoing application are hereby incorporated by reference herein, but priority to such application is not claimed.

TECHNICAL FIELD

Subject matter herein relates to solid state light-emitting devices, including light emitting diode (LED) chips (including LED array chips), devices incorporating one or more LED chips, as well as related fabrication methods.

BACKGROUND

Light emitting diodes (LEDs) are widely known solid-state lighting elements that are capable of generating light in response to an applied voltage. LEDs generally include a diode region having an n-type layer, a p-type layer and a p-n junction, with an anode and cathode contacting the p-type and n-type layers, respectively. The diode region may be epitaxially formed on a substrate, such as a sapphire, silicon, silicon carbide, gallium arsenide, gallium nitride, etc., growth substrate, but the completed device may or may not include a substrate. The diode region may be fabricated, for example, from silicon carbide, gallium nitride, gallium phosphide, aluminum nitride and/or gallium arsenide-based materials and/or from organic semiconductor-based materials.

Internal reflection within LED structures may results in the loss of light that would otherwise be available for extraction.

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Conventional color LCD display systems require color filters (e.g., red, green, and blue) that inherently reduce light utilization efficiency. Sequential illuminated LED displays, which utilize self-emitting LEDs and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays may include "RGB" three-color displays with arrayed red, green and blue LEDs, or "RG" two-color displays with arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches.

Additionally, due to the omnidirectional character of LED and phosphor emissions, it may be challenging to prevent emissions of one LED (e.g., a first pixel) from significantly overlapping emissions of another LED (e.g., a second pixel) of an array, which would impair the effective resolution of an LED array device. The art continues to seek improved LED array devices with small pixel pitches while overcoming limitations associated with conventional devices and production methods.

The art also continues to seek improved LED chips and associated lighting devices that provide improved light extraction.

SUMMARY

The present disclosure relates in various aspects to LED chips (including pixelated-LED chips) including substrate sidewalls with features such as sidewall involutions and/or increased sidewall surface area regions to affect (e.g., enhance) light extraction from light-transmissive substrate materials. In addition, LED lighting devices incorporating superstrates for supporting lumiphoric material may include superstrate sidewalls with sidewall involutions and/or increased sidewall surface area region, to affect (e.g., enhance) light extraction from light-transmissive superstrate materials. Methods for fabricating the foregoing items with sidewall features may include etching (e.g., deep etching) of substrate or superstrate materials, aided in certain embodiments by use of an etch mask having edges with non-linear shapes configured to produce and/or shape sidewall involutions when an etchant is supplied through the etch mask to selectively consume substrate or superstrate material.

In one aspect, the disclosure relates to a LED chip that comprises: an active layer; a substrate comprising a light-transmissive material with a light extraction face laterally bounded by a plurality of substrate sidewalls; and an anode and a cathode associated with the active layer. Each substrate sidewall of the plurality of substrate sidewalls comprises at least one of the following features (a) or (b): each substrate sidewall comprises a plurality of sidewall involutions that are substantially aligned in a direction generally parallel to a height direction of the substrate sidewall; or (b) each substrate sidewall comprises a plurality of non-coplanar surface portions that confer a sidewall surface area at least 30% greater than a comparable substrate sidewall of the same length and height dimensions but devoid of non-coplanar surface portions.

In certain embodiments, each substrate sidewall comprises an etched surface.

In certain embodiments, each substrate sidewall comprises a plurality of sidewall involutions that are substantially aligned in a direction generally parallel to a height direction of the substrate sidewall.

In certain embodiments, for each substrate sidewall of the plurality of substrate sidewalls, at least some sidewall involutions of the plurality of sidewall involutions extend at least 0.5 micrometer into the substrate sidewall in a direction perpendicular to a length of the substrate sidewall at a midpoint height of the substrate sidewall.

In certain embodiments, at least some sidewall involutions of the plurality of sidewall involutions are present in an amount of at least 2 involutions per micrometer of substrate sidewall length.

In certain embodiments, each substrate sidewall comprises a plurality of non-coplanar surface portions that confer a sidewall surface area at least 30% greater than a comparable substrate sidewall of the same length and height dimensions but devoid of non-coplanar surface portions.

In certain embodiments, each substrate sidewall comprises a plurality of non-coplanar surface portions that confer a sidewall surface area in a range of from 30% greater to 100% greater than a comparable substrate sidewall of the same length and height dimensions but devoid of non-coplanar surface portions.

In certain embodiments, wherein the substrate comprises silicon carbide or sapphire. In certain embodiments, the substrate comprises a growth substrate on which the active layer was grown.

In certain embodiments, the LED chip further comprises at least one lumiphoric material arranged on or over the light extraction face, wherein the at least one lumiphoric material is configured to receive at least a portion of light emitted by the active layer and responsively generate lumiphor emissions.

In certain embodiments, the light extraction face comprises a non-repeating irregular textural pattern.

In another aspect, the disclosure relates to a pixelated-LED chip that comprises: an active layer comprising a plurality of active layer portions; a substrate comprising a plurality of substrate portions supporting the plurality of active layer portions, wherein each substrate portion comprises a light-transmissive material with a light extraction face laterally bounded by a plurality of substrate sidewalls; and a plurality of anode-cathode pairs associated with the plurality of active layer portions. Each active layer portion of the plurality of active layer portions is configured to illuminate a different substrate portion of the plurality of substrate portions and transmit light through the light extraction face of the substrate portion, such that the plurality of active layer portions and the plurality of discontinuous substrate portions form a plurality of pixels. Additionally, each substrate sidewall of the plurality of substrate sidewalls comprises at least one of the following features (a) or (b): (a) each substrate sidewall comprises a plurality of sidewall involutions that are substantially aligned in a direction generally parallel to a height direction of the substrate sidewall; or (b) each substrate sidewall comprises a plurality of non-coplanar surface portions that confer a sidewall surface area at least 50% greater than a comparable substrate sidewall of the same length and height dimensions but devoid of non-coplanar surface portions.

In certain embodiments, each substrate sidewall comprises an etched surface.

In certain embodiments, each substrate sidewall comprises a plurality of sidewall involutions that are substantially aligned in a direction generally parallel to a height direction of the substrate sidewall.

In certain embodiments, for each substrate sidewall of the plurality of substrate sidewalls, at least some sidewall involutions of the plurality of sidewall involutions extend at least 0.5 micrometer into the substrate sidewall in a direction perpendicular to a length of the substrate sidewall at a midpoint height of the substrate sidewall.

In certain embodiments, at least some sidewall involutions of the plurality of sidewall involutions are present in an amount of at least 2 involutions per micrometer of substrate sidewall length.

In certain embodiments, each substrate sidewall comprises a plurality of non-coplanar surface portions that confer a sidewall surface area at least 30% greater than a comparable substrate sidewall of the same length and height dimensions but devoid of non-coplanar surface portions.

In certain embodiments, each substrate sidewall comprises a plurality of non-coplanar surface portions that confer a sidewall surface area in a range of from 30% greater to 100% greater than a comparable substrate sidewall of the same length and height dimensions but devoid of non-coplanar surface portions.

In certain embodiments, the substrate comprises silicon carbide or sapphire. In certain embodiments, the substrate comprises a growth substrate on which the active layer was grown.

In certain embodiments, for each substrate portion of the plurality of substrate portions, at least one lumiphoric material is arranged on or over the light extraction face, and the at least one lumiphoric material is configured to receive at least a portion of light emitted by the active layer and responsively generate lumiphor emissions.

In certain embodiments, for each substrate portion of the plurality of substrate portions, wherein the light extraction face comprises a non-repeating irregular textural pattern.

In another aspect, the disclosure relates to a method for fabricated a pixelated-LED chip, the method comprising: applying an etch mask to a subassembly comprising an active layer supported by a substrate of light transmissive material, the etch mask comprising a plurality of apertures forming an aperture pattern and being arranged over the active layer; supplying an etchant through the plurality of apertures of the etch mask to define a plurality of streets, wherein the plurality of streets extend through an entire thickness of the active layer to form a plurality of active layer portions, and the plurality of streets extend to a depth of at least 30 microns into, but through less than an entire thickness of, the substrate to form a plurality of substrate sidewalls; and thinning an entire upper region of the substrate to create openings into the plurality of streets and form a plurality of discontinuous substrate portions bounding the plurality of streets; wherein each substrate portion of the plurality of discontinuous substrate portions comprises a light extraction face laterally bounded by the substrate sidewalls, and wherein the plurality of active layer portions and the plurality of discontinuous substrate portions form a plurality of pixels.

In certain embodiments, the plurality of streets extend to a depth of at least 50 microns into the substrate.

In certain embodiments, the thinning of the entire upper region of the substrate comprises reducing a thickness of the substrate to a value of no greater than 30 microns. In certain embodiments, the thinning of the entire upper region of the substrate comprises grinding the entire upper region of the substrate.

In certain embodiments, the plurality of apertures comprise a plurality of intersecting lines, and the aperture pattern comprises a rectangular grid.

In certain embodiments, each substrate portion of the plurality of discontinuous substrate portions comprises a light extraction face laterally bounded by substrate sidewalls of the plurality of substrate sidewalls, and each substrate sidewall of the plurality of substrate sidewalls comprises a plurality of sidewall involutions that are substantially aligned in a generally parallel to a height direction of the substrate sidewall.

In certain embodiments, for each substrate sidewall of the plurality of substrate sidewalls, at least some sidewall involutions of the plurality of sidewall involutions extend at least 0.5 micrometer into the substrate sidewall in a direction perpendicular to a length of the substrate sidewall at a midpoint height of the substrate sidewall.

In certain embodiments, at least some sidewall involutions of the plurality of sidewall involutions are present in an amount of at least 2 involutions per micrometer of substrate sidewall length.

In certain embodiments, each substrate sidewall comprises a plurality of non-coplanar surface portions that confer a sidewall surface area at least 30% greater than a comparable substrate sidewall of the same length and height dimensions but devoid of non-coplanar surface portions.

In certain embodiments, each substrate sidewall comprises a plurality of non-coplanar surface portions that confer a sidewall surface area in a range of from 30% greater to 100% greater than a comparable substrate sidewall of the same length and height dimensions but devoid of non-coplanar surface portions.

In certain embodiments, wherein the etch mask comprises a plurality of edges registered with the plurality of apertures, and at least some edges of the plurality of edges comprise a non-linear shape configured to produce sidewall involutions on substrate sidewalls of the plurality of substrate sidewalls.

In certain embodiments, the non-linear shape comprises a sawtooth or multi-tooth shape.

In certain embodiments, the method further comprises providing a plurality of anode-cathode pairs in electrical communication with the plurality of active layer portions, wherein the plurality of active layer portions is arranged between the plurality of anode-cathode pairs and the substrate.

In certain embodiments, the substrate comprises silicon carbide or sapphire.

In another aspect, the disclosure relates to a method for fabricating at least one LED chip, the method comprising: applying an etch mask to a subassembly comprising an active layer supported by a substrate, the etch mask comprising a plurality of edges, being arranged over the active layer, and defining openings; and supplying an etchant through openings of the etch mask to consume portions of the active layer and define a plurality of recesses in the substrate, wherein the plurality of recesses extend to a depth of at least 30 microns into the substrate to form a plurality of substrate sidewalls; wherein the substrate comprises an outer substrate surface bounded by the substrate sidewalls; and wherein at least some edges of the plurality of edges of the etch mask comprise a non-linear shape configured to produce sidewall involutions on substrate sidewalls of the plurality of substrate sidewalls In certain embodiments, the non-linear shape comprises a sawtooth or multi-tooth shape.

In certain embodiments, the plurality of recesses extend to a depth of at least 50 microns into the substrate.

In certain embodiments, the method further comprises thinning an entire upper region of the substrate to create openings into the plurality of recesses and form a plurality of discontinuous substrate portions bounding the plurality of recesses.

In certain embodiments, the thinning of the entire upper region of the substrate comprises reducing a thickness of the substrate to a value of no greater than 30 microns. In certain embodiments, the thinning of the entire upper region of the substrate comprises grinding the entire upper region of the substrate.

In certain embodiments, the apertures in the etch mask form a rectangular grid.

In certain embodiments, the method further comprises applying a lumiphoric material over a light extraction face of the substrate, wherein the light extraction face is laterally bounded by substrate sidewalls of the plurality of substrate sidewalls.

In certain embodiments, the substrate comprises silicon carbide or sapphire.

In another aspect, the disclosure relates to a LED lighting device comprising: at least one active layer portion supported by at least one substrate portion; a lumiphoric material arranged to receive emissions from the at least one active layer portion and responsively emit lumiphor emissions; and a light-transmissive superstrate arranged to receive emissions from one or more of (i) the at least one active layer portion or (ii) the lumiphoric material; wherein the light-transmissive superstrate comprises a light-transmissive outward face arranged substantially along a first plane and comprises a plurality of superstrate sidewalls; and wherein each superstrate sidewall comprises at least one of the following features (a) or (b): (a) each superstrate sidewall comprises a plurality of sidewall involutions that are substantially aligned in a direction generally parallel to a height direction of the superstrate sidewall; or (b) each superstrate sidewall comprises a plurality of non-coplanar surface portions that confer a sidewall surface area at least 30% greater than a comparable superstrate sidewall of the same length and height dimensions but devoid of non-coplanar surface portions.

In certain embodiments, each superstrate sidewall comprises an etched surface.

In certain embodiments, the lumiphoric material is arranged between the superstrate and the at least one active layer portion.

In certain embodiments, each superstrate sidewall comprises a plurality of sidewall involutions that are substantially aligned in a direction generally parallel to a height direction of the superstrate sidewall.

In certain embodiments, for each superstrate sidewall of the plurality of superstrate sidewalls, at least some sidewall involutions of the plurality of sidewall involutions extend at least 0.5 micrometer into the superstrate sidewall in a direction perpendicular to a length of the superstrate sidewall at a midpoint height of the superstrate sidewall.

In certain embodiments, at least some sidewall involutions of the plurality of sidewall involutions are present in an amount of at least 2 involutions per micrometer of substrate sidewall length.

In certain embodiments, each superstrate sidewall comprises a plurality of non-coplanar surface portions that confer a sidewall surface area at least 30% greater than a comparable superstrate sidewall of the same length and height dimensions but devoid of non-coplanar surface portions.

In certain embodiments, each superstrate sidewall comprises a plurality of non-coplanar surface portions that confer a sidewall surface area in a range of from 30% greater to 100% greater than a comparable superstrate sidewall of the same length and height dimensions but devoid of non-coplanar surface portions.

In certain embodiments, the superstrate comprises silicon carbide or sapphire. In certain embodiments, the superstrate comprises glass.

In certain embodiments, the light-transmissive outward face comprises a non-repeating irregular textural pattern.

In another aspect, the disclosure relates to a method for fabricating a LED lighting device, the method comprising: applying an etch mask to a superstrate of light-transmissive material, the etch mask comprising a plurality of edges and defining openings; and supplying an etchant through openings of the etch mask to consume portions of the superstrate and define a plurality of recesses in the superstrate, wherein the plurality of recesses extend to a depth of at least 30 microns into the superstrate to form a plurality of superstrate sidewalls; wherein the superstrate comprises an outer superstrate surface bounded by the superstrate sidewalls; and wherein at least some edges of the plurality of edges of the etch mask comprise a non-linear shape configured to produce sidewall involutions on superstrate sidewalls of the plurality of superstrate sidewalls.

In certain embodiments, the non-linear shape comprises a sawtooth or multi-tooth shape.

In certain embodiments, the plurality of recesses extend to a depth of at least 50 microns into the superstrate.

In certain embodiments, for each substrate sidewall of the plurality of superstrate sidewalls, at least some sidewall involutions of the plurality of sidewall involutions extend at least 0.5 micrometer into the superstrate sidewall in a direction perpendicular to a length of the substrate sidewall at a midpoint height of the superstrate sidewall.

In certain embodiments, at least some sidewall involutions of the plurality of sidewall involutions are present in an amount of at least 2 involutions per micrometer of superstrate sidewall length.

In certain embodiments, the method further comprises applying a lumiphoric material to at least one face of the superstrate.

In certain embodiments, the method further comprises mounting the superstrate over an active layer of at least one light emitting diode chip.

In certain embodiments, the method further comprises mounting the superstrate over a plurality of active layer regions of one or more LED chips; and thinning an entire upper region of the substrate to create openings into the plurality of recesses and form a plurality of discontinuous superstrate portions bounding the plurality of recesses.

In certain embodiments, the outer superstrate surface comprises a non-repeating irregular textural pattern.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
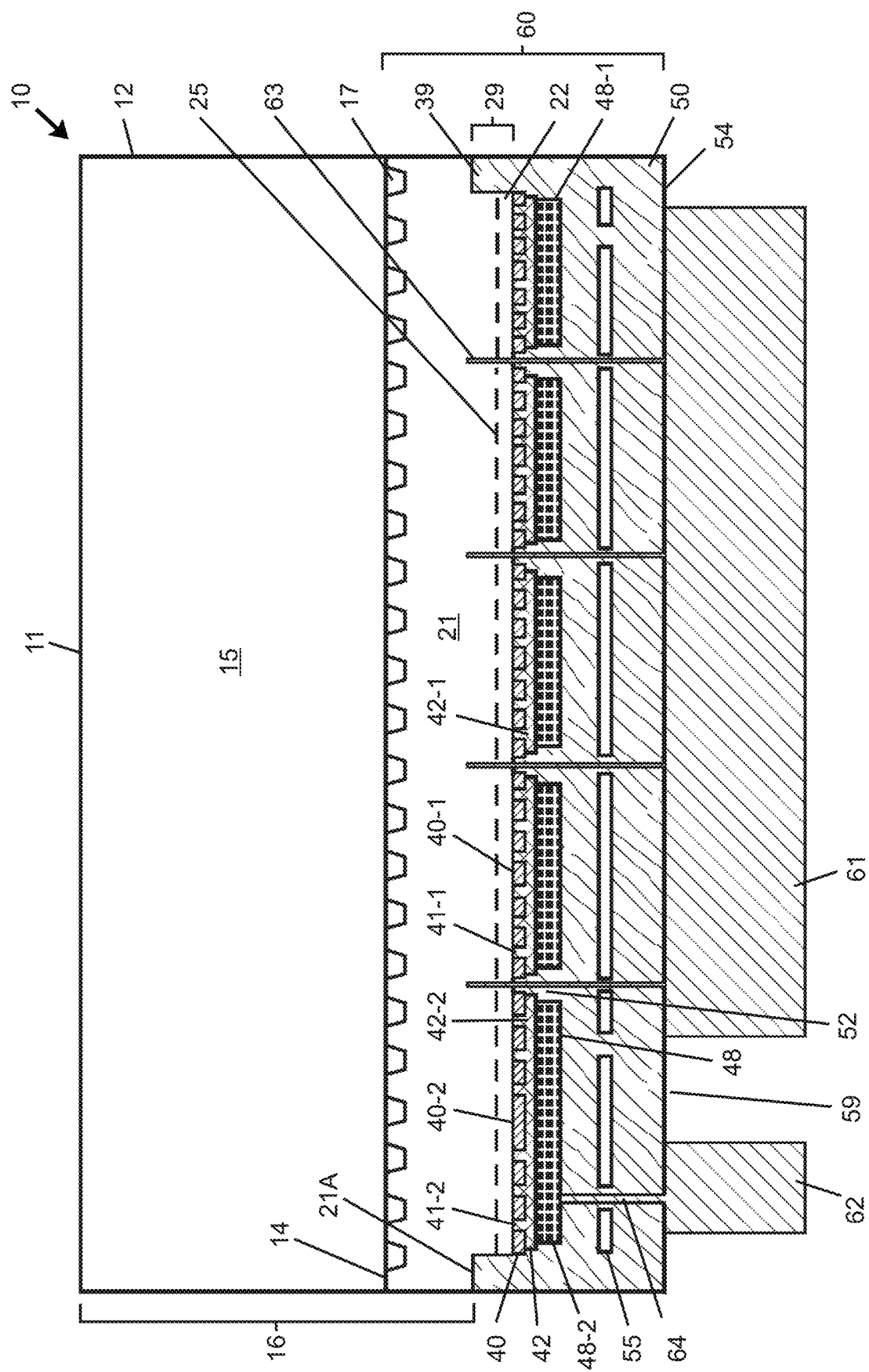
FIG. 1 is a side cross-sectional illustration of a flip chip light emitting diode (LED) being representative of flip chips that may be used in flip chip LED arrays according to embodiments of the present disclosure.

Disclosed herein are LED chips (including pixelated-LED chips) including substrate sidewalls with features such as sidewall involutions and/or increased sidewall surface area regions to affect (e.g., enhance) light extraction from light-transmissive substrate materials. The substrate etching may comprise deep chemical etching coinciding with formation of streets through an active layer to form multiple active layer portions. Further disclosed are LED lighting devices incorporating superstrates for supporting lumiphoric material, including superstrate sidewalls with sidewall involutions and/or increased sidewall surface area region, to affect (e.g., enhance) light extraction from light-transmissive superstrate materials. Methods for fabricating the foregoing items with sidewall features may include etching (e.g., deep etching) of substrate or superstrate materials, aided in certain embodiments by use of an etch mask having edges with non-linear shapes configured to produce and/or shape sidewall involutions when an etchant is supplied through the etch mask to selectively consume substrate or superstrate material.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, entirely through a thickness of the substrate, into a plurality of discontinuous substrate portions that support a different active layer portion in each pixel. Depending on the embodiment, the pixelated-LED chip may include lumiphoric materials, including phosphors or other conversion materials, and other physical optical structures that are integral with the pixelated-LED chip.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

Solid state light emitting devices disclosed herein may include at least one solid state light source (e.g., an LED chip or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of an LED array or a pixelated-LED chip. In certain embodiments, a lumiphoric material composition may be dispensed or otherwise applied in fluid form (e.g., akin to a gel, such as with lumiphoric material particles dispersed in silicone or another binding material) on or over a light extraction surface, and then leveling the lumiphoric material composition by skimming a surface thereof with a flat edge such as a squeegee, followed by curing and solidification of any binding material. In certain embodiments, a lumiphoric material may be located on a growth substrate, on epitaxial layers, and/or on a carrier substrate of an LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500 K to 10,000 K. In certain embodiments, lumiphoric materials having cyan, green, amber, yellow, orange, and/or red peak wavelengths may be used. In certain embodiments, lumiphoric materials may be added to one or more emitting surfaces (e.g., a top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric materials and/or scattering materials that differs in (a) composition, (b) concentration, (c) particle size, or (d) distribution with respect to different pixels.

In certain embodiments, a scattering material may be provided between a substrate and a lumiphoric material, or may be incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide ($TiO_2$), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide (SiC) or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (Ag) (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices or flip chip pixelated-LED chips in which a light-transmissive substrate (and particularly, discontinuous portions of the substrate) represent(s) the exposed light emitting surface. In certain embodiments, the light-transmissive substrate embodies or includes an LED growth substrate, wherein multiple LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (e.g., spanning an entire width) of a growth substrate and/or portions of epitaxial layers may be thinned or removed. In certain embodiments, a second substrate (such as a carrier substrate or a temporary substrate to perform chip processing) may be added to the pixelated-LED chip or precursor thereof, whether or not a growth substrate has been partially or fully removed. In certain embodiments, a light-transmissive substrate includes SiC, sapphire, or glass. Multiple LEDs (e.g., flip chip LEDs or flip chip pixels) may be grown on a substrate and incorporated into a light emitting device. In certain embodiments, a substrate (e.g., silicon (Si)) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates that are optionally patterned along an internal surface adjacent to semiconductor layers (e.g., semiconductor layers forming an active region, with patterning between the substrate and the active region). A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of an LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

In certain embodiments, an outward light extraction surface of a substrate (whether a growth substrate or a substrate bonded to a subassembly that includes an active region) may comprise a microtextured etched surface having a non-repeating, irregular textural pattern (e.g., with an average feature depth in a range of from 120 nm to 400 nm, and preferably free of any plurality of equally sized, shaped, and spaced textural features). In certain embodiments, a microtextured etched surface of a substrate may be formed after thinning of the substrate, and after underfill steps (such as disclosed herein) are completed, but prior to application of a lumiphoric material over the substrate. The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. Methods for forming such a surface are disclosed in U.S. Provisional Patent Application No. 63/044,746 filed on Jun. 26, 2020 and naming Cree, Inc. as the Applicant, wherein the entire disclosure of such application is hereby incorporated by reference herein.

In certain embodiments, a non-repeating, irregular textural pattern of a microtextured etched surface may comprise an average feature depth in a range of from 120 nm to 400 nm, or in a range of 150 nm to 350 nm, or in a range of 200 nm to 350 nm. In certain embodiments, a non-repeating, irregular textural pattern may include multiple plateau regions with localized pits defined in upper surfaces thereof. A plateau region may have a predominantly flat upper surface except along lateral boundaries thereof (which may have rounded edges toward lower-lying areas) and except for the presence of pitted areas. Valley regions of various widths may be provided between plateau regions. In certain embodiments, plateau regions may be interconnected in various irregular shapes. In certain embodiments, at least some plateau regions may comprise substantially parallel scoring marks along upper surfaces thereof, with such scoring marks having been imparted by surface grinding (e.g., prior to masking and etching). In certain embodiments, a non-repeating irregular textural pattern may comprise a tiered microstructure including plateau regions provided at different heights. In certain embodiments, a tiered microstructure may include a first plurality of plateau regions at a first height and a second plurality of plateau regions at a second height that differs from the first height, with the presence of valley regions and/or pit regions that are deeper than the first and second pluralities of plateau regions.

In certain embodiments, a non-repeating, irregular textural pattern includes a plurality of irregularly shaped first features of a first height, a plurality of valley regions extending between different irregularly shaped first features, and a plurality of irregularly shaped second features of a second height that is less than the first height, with the plurality of irregularly shaped second features being arranged within the plurality of valley regions. In certain embodiments, at least some of the plurality of irregularly shaped first features of a first height comprise plateau regions When etching is performed to provide a substrate with a microtextured etched surface as an outward light extraction surface thereof, the presence of a scattering material (e.g., $TiO_2$) at a high concentration in trenches or streets proximate to the outward light extraction surface may be beneficial to shield the trenches from an etchant (such as reactive ion etching plasma). $TiO_2$ is substantially unaffected by RIE plasma. If a high concentration of $TiO_2$ is absent from at least an upper portion of a trench proximate to a light extraction surface of a substrate, then the etchant may attack passivation material that may be proximate to an active region (or other wafer fabricated areas) along sidewalls of the trench. This ability of $TiO_2$ (i.e., when present at high concentrations) to shield sidewall portions of trenches between pixels therefore provides a protective benefit separate from any optical benefits that may be conferred by its reflective properties.

In certain embodiments, LEDs or pixels may be grown on a first substrate of a first material (e.g., Si, SiC, or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used such as van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, an LED array includes multiple flip chip LEDs or flip chip pixels grown on a single first (or growth) substrate, with the first substrate removed from the LEDs, and a second substrate (or carrier) added to the LEDs, with the second substrate including one or more reflective layers, vias, and a phosphor layer (e.g., spin-coated phosphor layer). In certain embodiments, an LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include Si, SiC, a Group III-nitride material (e.g., GaN), or any combination of the foregoing materials (e.g., Si on sapphire, etc.). Further details regarding fabrication of flip chip LEDs are disclosed in U.S. Patent Application Publication No. 2017/0098746A1, with the entire contents thereof being hereby incorporated by reference herein.

Figure 3A:
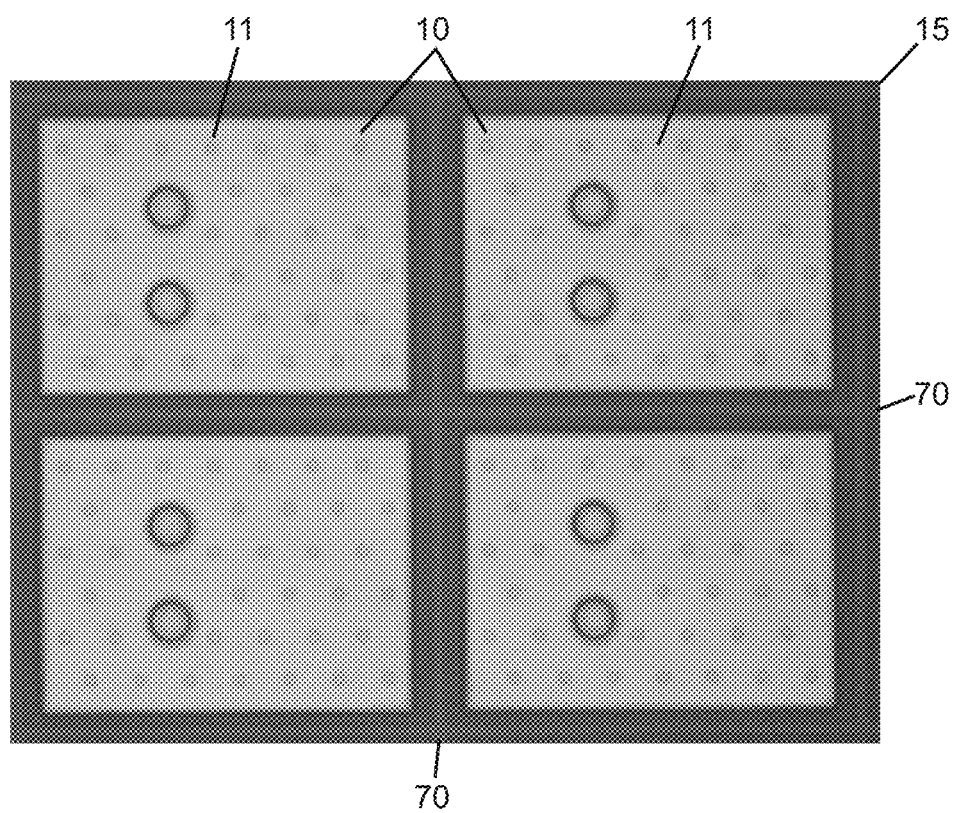
FIG. 3A is a plan view photograph of a pixelated-LED chip including an array of four flip chip type LEDs on a single transparent substrate facing upward, useable in embodiments of the present disclosure.
Figure 3B:
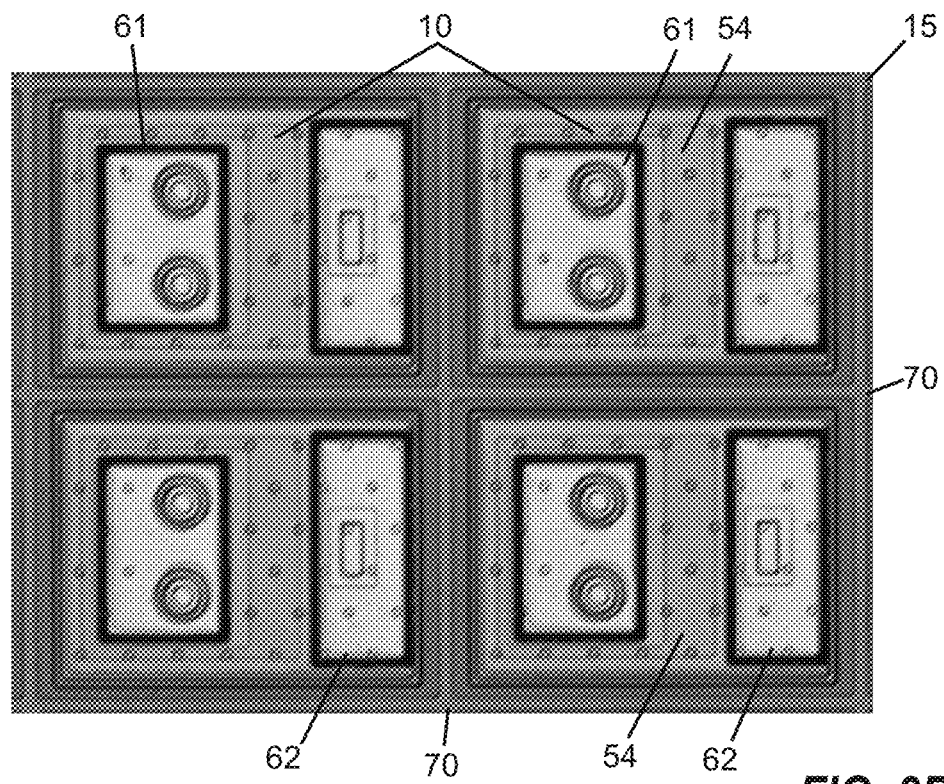
FIG. 3B is a plan view photograph of the pixelated-LED chip of FIG. 3A, with electrodes facing upward.
Figure 4A:
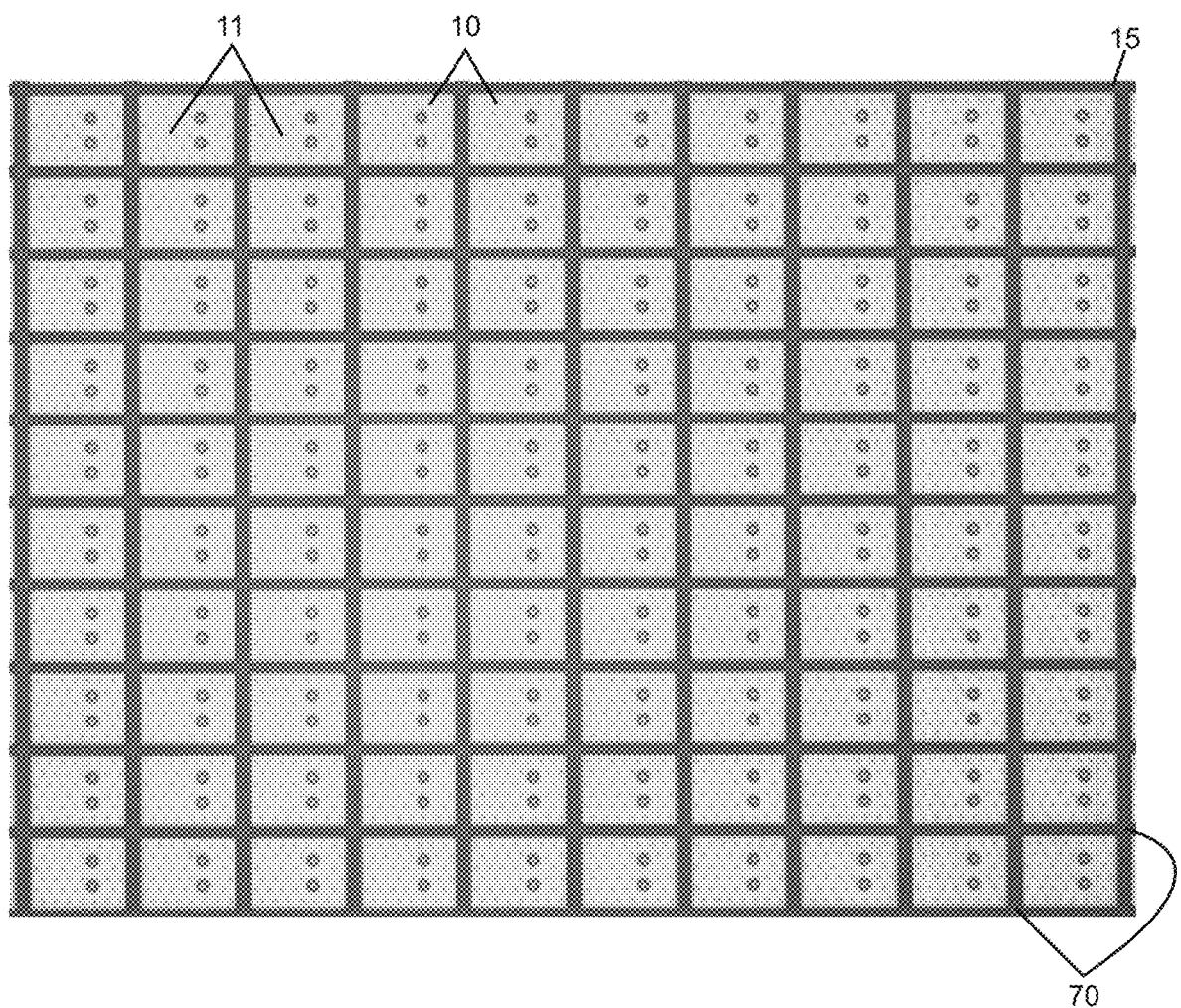
FIG. 4A is a plan view photograph of a pixelated-LED chip including an array of one hundred flip chip LEDs on a single transparent substrate facing upward, useable in embodiments of the present disclosure.
Figure 4B:
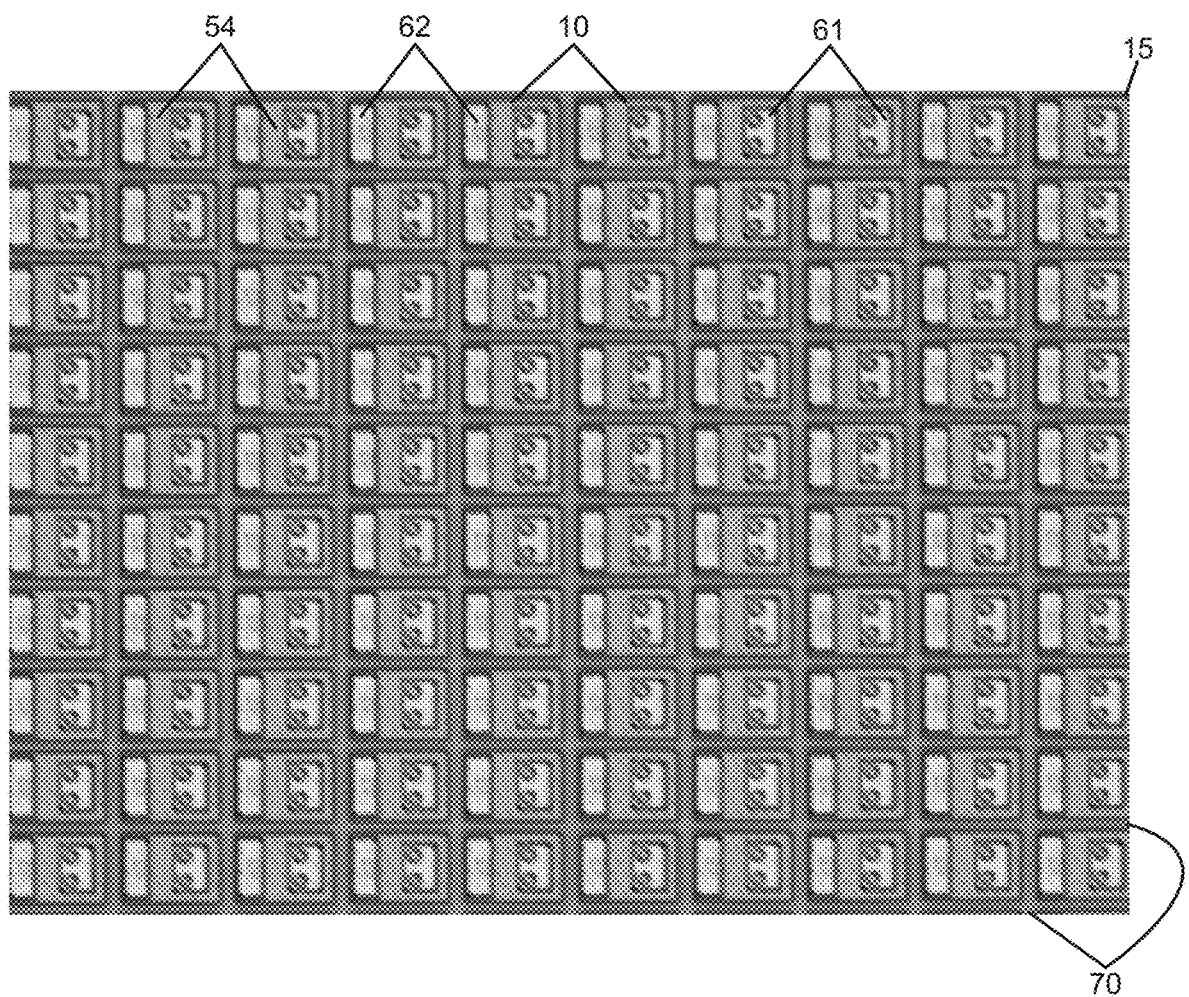
FIG. 4B is a plan view photograph of the pixelated-LED chip of FIG. 4A, with electrodes facing upward.
Figure 5:
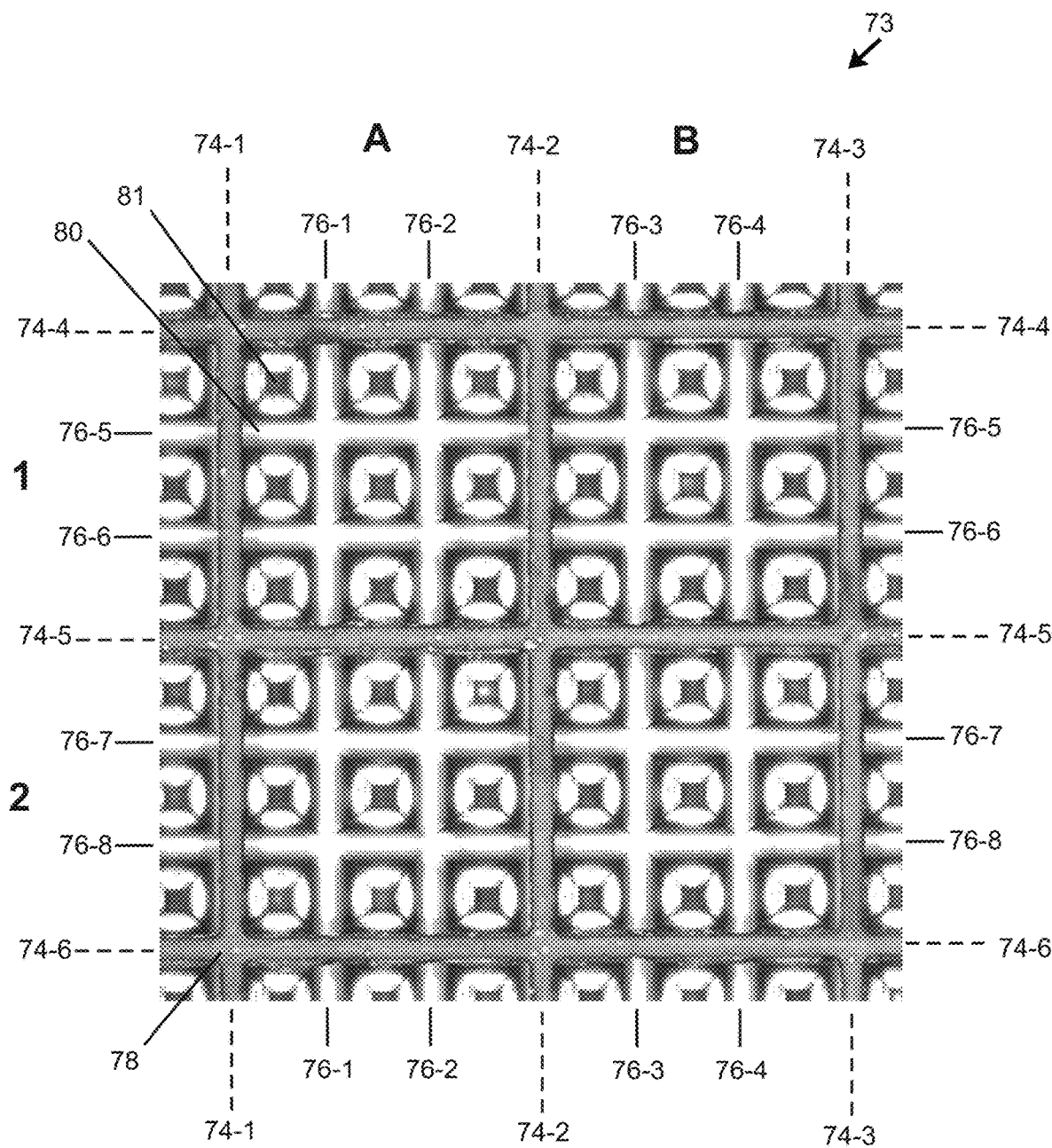
FIG. 5 is an upper perspective view photograph of a portion of a pixelated-LED light emitting device incorporating pixelated-LED chips according to a design in which light extraction surfaces have macrotextural features, in order to illustrate pixel placement and spacing.

FIGS. 1 to 4B depict pixelated-LED chips to provide a general introduction to features thereof, and FIG. 5 illustrates a device incorporating multiple pixelated LED chips, as features of these figures may be incorporated into pixelated-LED chips and fabrication steps according to various embodiments that will be described thereafter (e.g., in connection with FIGS. 6A-6I).

FIG. 1 illustrates a single flip chip LED 10 including a light-transmissive substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to multiple semiconductor layers 21, 22 of the LED 10, including a multi-layer reflector proximate to the semiconductor layers 21, 22 according to one embodiment. The light-transmissive (preferably transparent) substrate 15 has an outer major surface 11, side edges 12, and the patterned surface 14. The multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and a second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride (SiN) as part of a passivation layer 50), and that is vertically bounded by surface extensions 21A of the first semiconductor layer 21.

The multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide ($SiO_2$), and the metal reflector layer 42 comprises Ag. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42. In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa 29 of the second semiconductor layer 22).

A barrier layer 48 (including first and second portions 48-1, 48-2) is preferably provided between the metal reflector layer 42 and the passivation layer 50. In certain implementations, the barrier layer 48 comprises sputtered titanium (Ti)/platinum (Pt) followed by evaporated gold (Au), or comprises sputtered Ti/nickel (Ni) followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises SiN. The passivation layer 50 includes a metal-containing interlayer 55 arranged therein, wherein the interlayer 55 may include (or consist essentially of) aluminum (Al) or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within the openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through the openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and the surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, the conductive vias 41-2, the second metal reflector layer portion 42-2, the second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, the recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

Figure 2A:
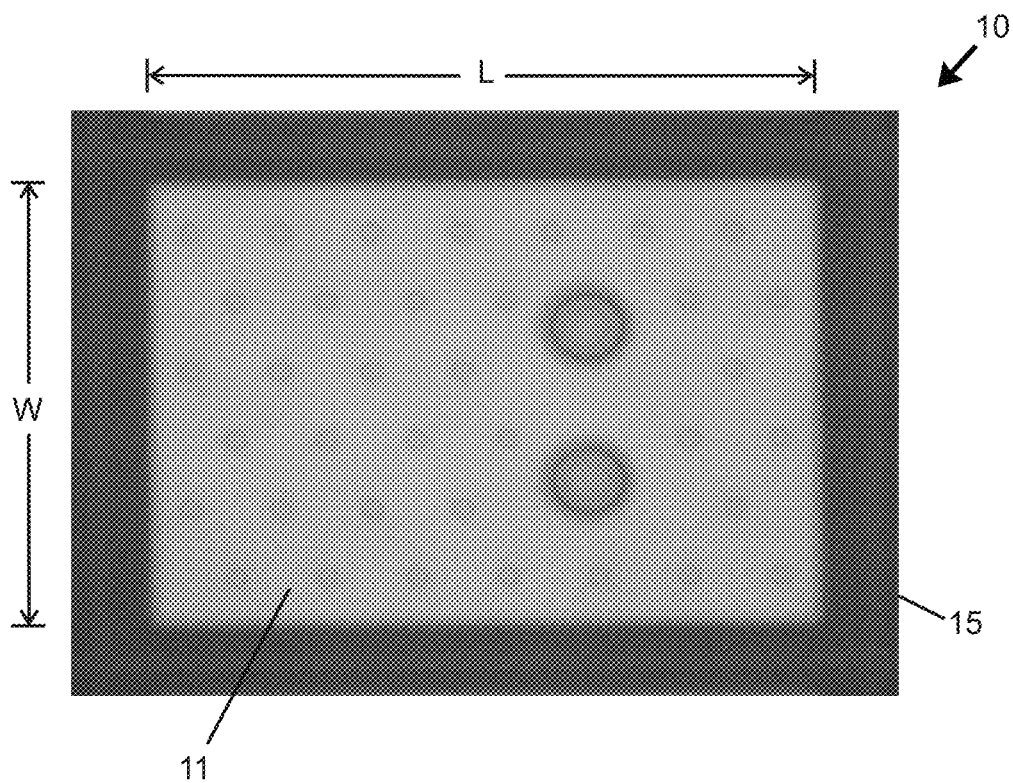
FIG. 2A is a plan view photograph of a flip chip LED, with a transparent substrate facing upward, useable in flip chip arrays according to embodiments of the present disclosure.
Figure 2B:
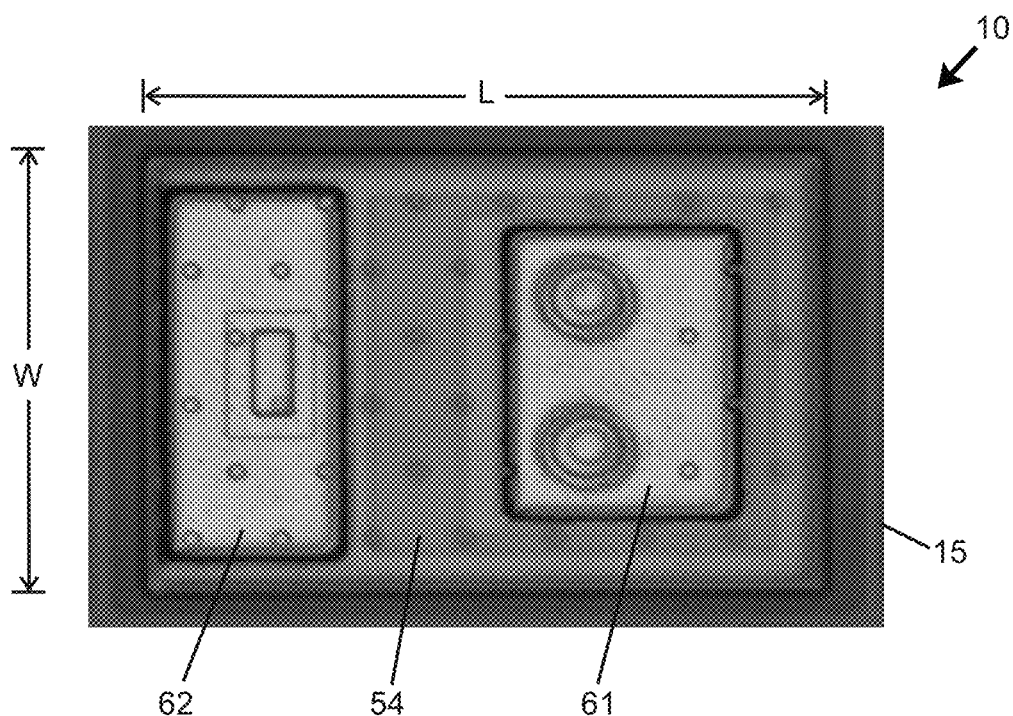
FIG. 2B is a plan view photograph of the flip chip LED of FIG. 2A, with electrodes facing upward.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns (μm), and a width W of about 220 μm, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 μm by 140 μm, and the anode 62 includes length and width dimensions of about 70 μm by 170 μm.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each adjacent flip chip LED 10 by a gap (e.g., 40 μm in a length direction and 30 μm in a width direction). A central portion of each gap embodies a street 70 (e.g., having a width of about 10 μm) consisting solely of the substrate 15, whereas peripheral portions of each gap (between each street 70 and active areas of LEDs 10) includes the substrate 15 as well as passivation material (e.g., the passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

In certain embodiments, each flip chip LED of an array of LEDs supported by a single substrate (e.g., a pixelated-LED chip) includes a greatest lateral dimension of no greater than about 400 μm, about 300 μm, or about 200 μm. In certain embodiments, each flip chip LED pixel of an array of LEDs supported by a single substrate includes inter-pixel spacing of no greater than about 60 μm, or about 50 μm, or about 40 μm, or about 30 μm, or about 20 μm, or about 10 μm. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 μm long×70 μm wide, each including an active region of about 50 μm long×50 μm wide, thereby providing a ratio of emitting area to total area of 0.0025 mm$^2$/0.0049 mm$^2$=0.51 (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 μm in the length direction and no greater than 30 μm in the width direction. In certain embodiments, each LED may include an emissive area of 280 μm long×210 μm wide (totaling an area of 0.0588 mm$^2$). Considering a total top area of 320 μm long×240 μm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED 10 as including two n-contact vias (embodying vertically offset circles registered with the n-contact or cathode 61), in certain embodiments, n-contacts and any associated n-contact vias may be shifted laterally and provided in a dark area outside the emitting area of each LED 10.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Embodiments disclosed herein may address this issue by providing light affecting elements (e.g., light segregation elements) configured to reduce interaction between emissions of different LEDs and/or lumiphoric material regions, thereby reducing scattering and/or optical crosstalk and preserving pixel-like resolution of the resulting emissions. In this manner, light segregation elements as described herein may additionally provide good contrast and/or sharpness between lit and unlit regions of LED arrays. In certain embodiments, exemplary light segregation elements may extend from a light injection surface into a substrate, may extend from a light extraction surface into a substrate, may extend outward from a light extraction surface, may be provided between sidewalls of adjacent pixels, or any combination of the foregoing. In certain embodiments, multiple light segregation elements may be defined by different methods in the same substrate and/or light emitting device.

In certain embodiments, light segregation utility may be provided in whole or in part by underfill material arranged between pixels of one or more pixelated-LED chips (wherein such underfill may also be provided between anodes and cathodes of pixels). According to such embodiments, one or more constituents of underfill material (such as particulate material constituents) may provide light scattering, light reflecting, or light absorbing utility. In certain embodiments, an underfill material comprises particulate material suspended in a binding material (e.g., silicone), which may be applied in a flowable state. In certain embodiments, such particulate material may include metallic materials, metallic oxide materials, and/or non-metallic materials such as (but not limited to) silica, including (but not limited to) fused silica, fumed silica, and glass spheres. In certain embodiments, an underfill material may comprise gel silicone such as DOWSIL™ JCR 6140 optical encapsulant, which is commercially available from The Dow Chemical Company (Midland, MI, USA).

FIG. 5 is an upper perspective view photograph of a portion of a pixelated-LED light emitting device 72 that incorporates pixelated-LED chips and includes an underfill material 73, with the device 72 showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 74-1 to 74-6 that define lateral borders and inter-pixel spaces between the pixels A1, A2, B1, and B2. Dashed lines extending outward beyond the image represent extensions of boundaries between pixels. The vertical and horizontal solid lines correspond to cut lines or regions 76-1 to 76-8 that are not aligned with streets between pixels. As shown, the cut lines or regions 76-1 to 76-8 are provided to form a macroscopically patterned surface to promote extraction of light from each pixel. The underfill material 73 is configured along the lateral borders of each pixel A1, A2, B1, B2 for improved contrast. The width of the street-aligned cut lines 74-1 to 74-6 forms at least a portion of the spacing between pixels. Each pixel A1, A2, B1, B2 of the pixelated-LED light emitting device 72 may be spaced from adjacent pixels by a distance no greater than about 60 µm, or about 50 µm, or about 40 µm, or about 30 µm, or about 20 µm, or about 10 µm, or in a range of from about 10 µm to about 30 µm, or in a range of from about 10 µm to about 20 µm. Such dimensional ranges provide a desirably small pixel pitch. The spacing between pixels also relates to the width of the underfill material 73 that is configured between adjacent pixels. For example, a 25 µm spacing between pixels allows more of the underfill material 73 (about 25 µm width) to be configured between adjacent pixels than a pixel spacing of 20 µm. Accordingly, more light may be reflected and redirected out of each pixel without leaking into an adjacent pixel by the underfill material 73 with 25 µm spacing compared to the underfill material 73 with 20 µm spacing, thereby providing improved contrast and pixel brightness. Notably, for a constant spacing between the street-aligned cut lines 74-1 to 74-6, a pixel spacing of 25 µm reduces the area of each pixel; however, the increase in the underfill material 73 may still provide brighter pixels with improved contrast.

The cut lines 76-1 to 76-8 form a plurality of light extraction surface recesses 78 that intersect and segregate a plurality of protruding features 80. For example, in the pixel A1, the vertical cut lines 76-1 and 76-2 and the horizontal cut lines 76-5 and 76-6 form two vertical and two horizontal light extraction surface recesses 78 that intersect and define nine protruding features 80. The shape of a cutting tool as well as the number and direction of cut lines defines the shape of the protruding features 80. In FIG. 5, the cut lines 76-1 to 76-4 are evenly spaced vertical lines that intersect with evenly spaced and orthogonal horizontal cut lines 76-5 to 76-8, and are formed with a beveled cutting tool. Accordingly, the protruding features 80 comprise square-base pyramidal shapes. If desired, the pyramidal shapes may comprise truncated pyramidal shapes, wherein such truncation may be vertical, lateral, or both vertical and lateral in character. Other shapes are possible, including triangle-shaped features, extruded triangle-shaped features and cuboid-shaped features. If desired, the cut lines 76-1 to 76-8 may comprise intersecting diagonal lines to form other shapes, such as diamond-shaped features or other polyhedral features.

FIG. 5 shows pixelated-LED chips with light extraction surfaces that have macrotextural features (e.g., formable by angle cutting with a rotary saw), but in certain embodiments, pixelated-LED chips may have light extraction surfaces devoid of macrotextural features. In certain embodiments, a light extraction surface of a pixelated-LED chip may embody a microtextured etched surface having a non-repeating, irregular textural pattern (e.g., with an average feature depth in a range of from 120 nm to 400 nm, and preferably free of any plurality of equally sized, shaped, and spaced textural features).

In certain embodiments, inter-pixel spaces may be provided between adjacent pixels in a pixelated-LED chip. Inter-pixel spaces are formed when individual pixels are defined within a pixelated-LED chip and may include spaces between various elements of adjacent pixels, including active layer portions, substrate portions, and electrical contacts, among others. In certain embodiments, an underfill material may be provided in the inter-pixel spaces to cover all lateral surfaces between adjacent pixels, to substantially fill entire inter-pixel spaces between adjacent pixels, and optionally arranged between an anode and a cathode of each pixel.

FIGS. 6A-6I are schematic cross-sectional views of various states of fabrication of a pixelated-LED chip including etching of trenches into a substrate followed by partial substrate removal in order to form pixels supported by discontinuous substrate portions, followed by addition of underfill material and lumiphoric material.

Figure 6A:
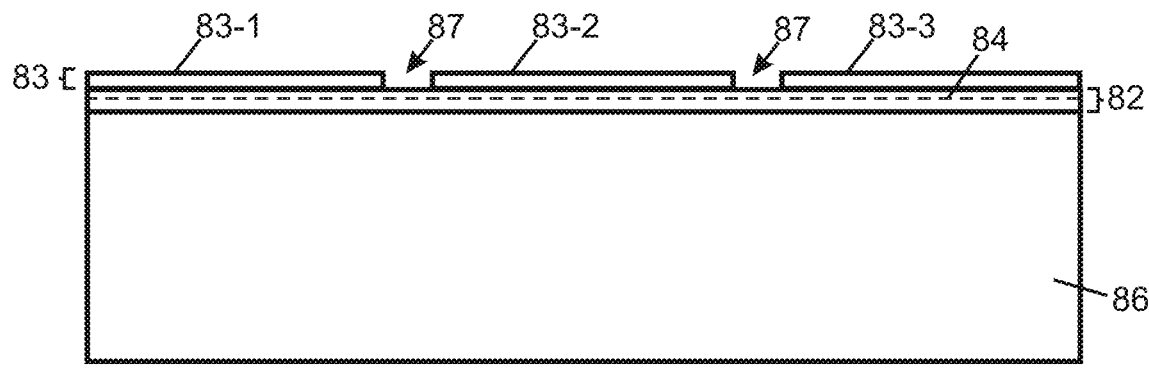
FIGS. 6A-6I are schematic cross-sectional views of various states of fabrication of a pixelated-LED chip including etching of trenches into a substrate followed by partial substrate removal in order to form pixels supported by discontinuous substrate portions, followed by addition of underfill material and lumiphoric material.

FIG. 6A depicts a LED structure 82 including an active layer 84 deposited on a substrate 86, with an etch mask including patterned etch mask regions 83-1 to 83-3 arranged over the LED structure 82. The LED structure 82 may include a plurality of epitaxial layers deposited by metal organic chemical vapor deposition (MOCVD). In addition to the active layer 84, the LED structure 82 may further include one or more n-type semiconductor layers and one or more p-type semiconductor layers. In some embodiments, the LED structure 82 includes Group III-V nitrides including but not limited to GaN, aluminum gallium nitride (AIGaN), aluminum indium gallium nitride (AlInGaN), and indium gallium nitride (InGaN). An exemplary n-type dopant is Si and an exemplary p-type dopant is magnesium (Mg). The active layer 84 may be configured between at least one n-type layer and one p-type layer. The active layer 84 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 86 may include a light-transmissive material such as SiC or sapphire, although other substrate materials may be used.

The etch mask regions 83-1 to 83-3 shown in FIG. 6A may be used to protect portions of the subassembly when exposed to a suitable etchant. Exposed regions 87 of the LED structure 82 between the etch mask regions 83-1 to 83-3 may be attacked (e.g., consumed) by a suitable (e.g. chemical) etchant to form trenches or recesses (88, shown in FIG. 6B) that extend through the LED structure 82 and into the substrate 86. Etching conditions (e.g., chemistry, time, etc.) may be adjusted to selectively remove material of the substrate 86 to a desired depth.

Figure 6B:
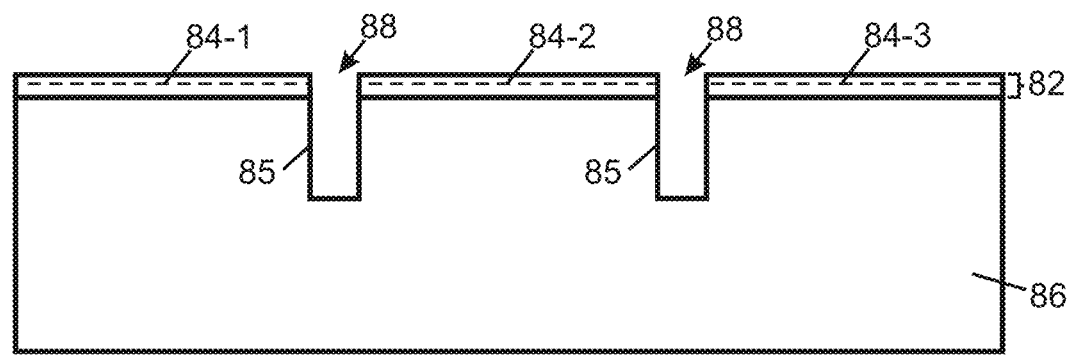

FIG. 6B depicts formation of a plurality of active layer portions 84-1 to 84-3 from the LED structure 82, following formation of trenches or recesses (also known as streets) 88 that segregate the active layer portions 84-1, 84-2, and 84-3, and following removal of the etch mask regions 83-1 to 83-3 shown in FIG. 6A. The recesses 88 in the substrate 86 are bounded by sidewalls 85. In certain embodiments, the substrate material comprises silicon carbide, a mask material comprises copper, and a hydrofluoric acid solution may be used as an etchant. In certain embodiments, the substrate material comprises sapphire, a mask material comprises aluminum nitride, and a mixture of sulfuric and phosphoric acids may be used as an etchant. Other substrate materials, mask materials, and/or etchants may be used.

Conventionally, recesses or streets 88 are formed to a relatively shallow depth that is sufficient to segregate the active layer portions 84-1, 84-2, and 84-3 and penetrate a short distance (e.g., 10 µm to 20 µm) into a substrate 86 of a material such as silicon carbide, wherein the substrate 86 may have an initial thickness of a few hundred µm (e.g., 200 µm to 400 µm, or about 325 µm in some instances). However, in certain embodiments of the present disclosure, recesses or streets 88 of a greater depth (e.g., at least 30 µm, at least 40 µm, at least 50 µm, or 30 µm to 45 µm, or 35 µm to 50 µm, or 30 µm to 60 µm into the substrate 86) may be defined by etching, such as selecting a longer etching time.

In developing the technology disclosed herein, it has been observed that etching of deep trenches 88 into the substrate 86 results in formation of involutions in sidewalls 85 bounding the trenches 88 defined in the substrate 86. Such involutions have been observed to be oriented in a direction substantially parallel to an etching direction (e.g., vertical, and/or in a direction substantially perpendicular to a face of a substrate). Sidewall involutions have been observed even when etch mask regions (e.g., 83-1 to 83-3 shown in FIG. 6A) have straight edges. In certain embodiments, at least some sidewall involutions extend from an upper boundary to a lower boundary of each sidewall 85 of the substrate 86.

In certain embodiments, a depth that the recesses or trenches 88 extend into the substrate 86 may be slightly greater than a desired height of substrate portions to be produced after the substrate 86 is subjected to a (post-etching) thinning process (such as grinding). For example, recesses 88 may be formed to a depth of about 38 µm to 40 µm into a substrate 86 having an initial thickness of about 325 µm, and then the substrate may be ground to a thickness of about 35 µm in exposed openings into the recesses 88 and segregate the substrate 86 into portions. By forming deep recesses 88 and then thinning an entire upper portion of a substrate 86, discontinuous substrate portions with openings into the recesses may be formed. Such process avoids a need for sawing trenches through a substrate registered with underlying (shallow) recesses (also referred to as streets when extending through an active layer) according to alternative processes, such as disclosed by U.S. Patent Application Publication No. 2020/0203419 A1.

Figure 6C:
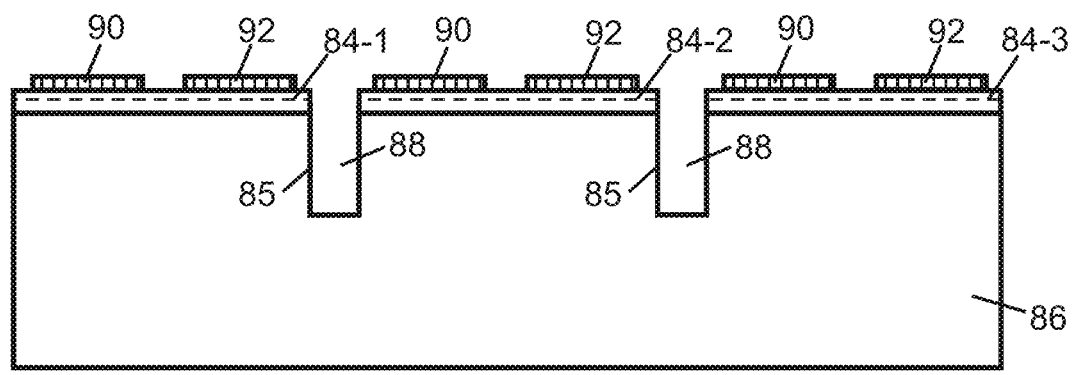

In FIG. 6C, electrical contacts that include an anode 90 and a cathode 92 are deposited over each of the active layer portions 84-1 to 84-3 to form a plurality of anode-cathode pairs 90, 92. Such deposition may be performed by conventional metallization techniques. As shown, each anode-cathode pair 90, 92 is segregated from each other anode-cathode pair 90, 92 by the recesses 88 defined in the substrate 86.

Figure 6D:
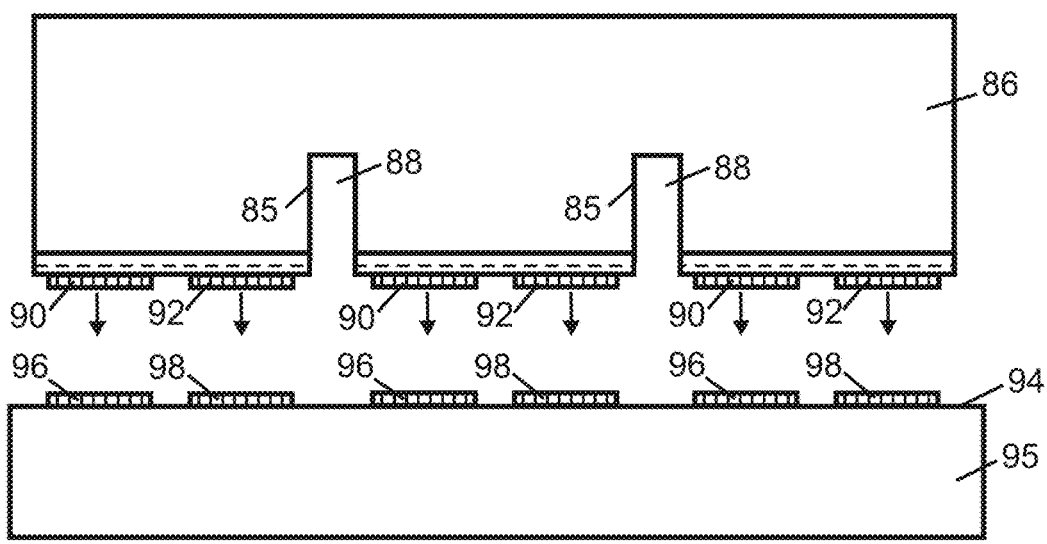
Figure 6E:
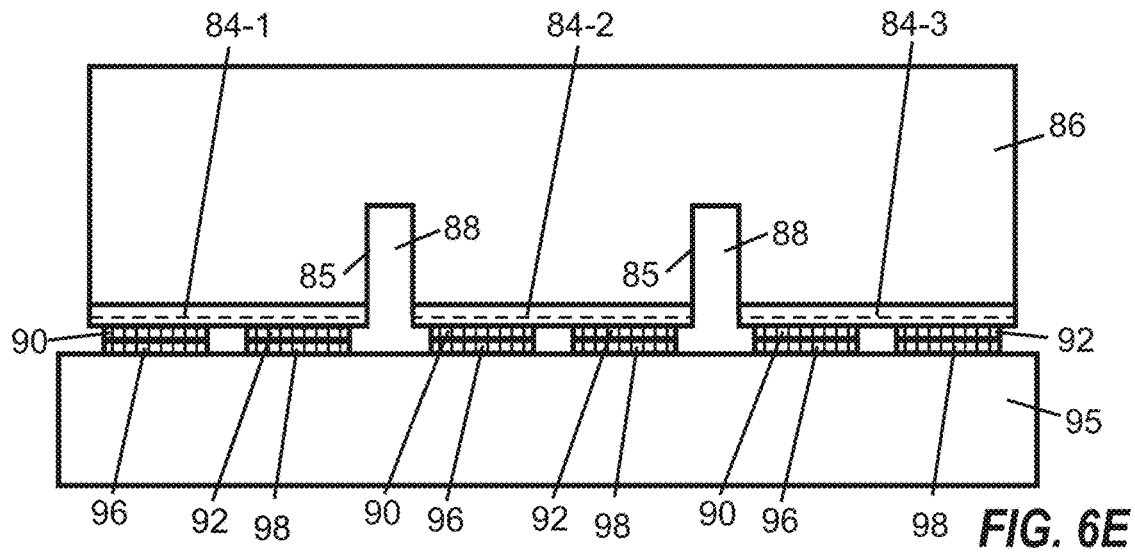

In FIG. 6D and FIG. 6E, the substrate 86 is flip-chip mounted over a mounting surface 94 (e.g., with the recesses 88 opening downward). In some embodiments, the mounting surface 94 is a surface of a submount 95 that includes a plurality of electrode pairs 96, 98. The submount 95 may comprise an active interface element such as an ASIC chip, a passive interface element that serves as an intermediate element that may be later-attached to an active interface element, or a temporary interface element that provides temporary support for subsequent manufacturing steps. For embodiments in which the submount 95 comprises a temporary interface element, the plurality of electrode pairs 96, 98 may be omitted. The flip-chip mounting comprises establishing electrically conductive paths between the plurality of anode-cathode pairs 90, 92 and the plurality of electrode pairs 96, 98. In some embodiments, the plurality of anode-cathode pairs 90, 92 are planarized before flip-chip mounting to correct any variations in thicknesses from the anode-cathode deposition. Such planarization helps ensure that reliable electrical contacts may be made across the electrode pairs 96, 98 distributed across the entire interface between the submount 95 and the substrate 86, and avoids variation in interfacial height that would otherwise promote cracking of the substrate 86 when the substrate 86 is mechanically processed (e.g., thinned and shaped) in subsequent steps. The submount 95 may include a plurality of separate electrical paths, including one electrical path for each electrode pair of the plurality of electrode pairs 96, 98. In this regard, each of the active layer portions 84-1 to 84-3 may be independently electrically accessible. Additionally, this allows a group or subgroup of the active layer portions (e.g., 84-1 and 84-2) to be accessed together, independently of other active layer portions (e.g., 84-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 90, 92 and the plurality of electrode pairs 96, 98. In some embodiments, residue from the mounting step may be left in undesired areas between the substrate 86 and the submount 95 (such as in the recesses 88), and a cleaning step (such as an ultrasonic clean), may be used to remove the residue.

Figure 6F:
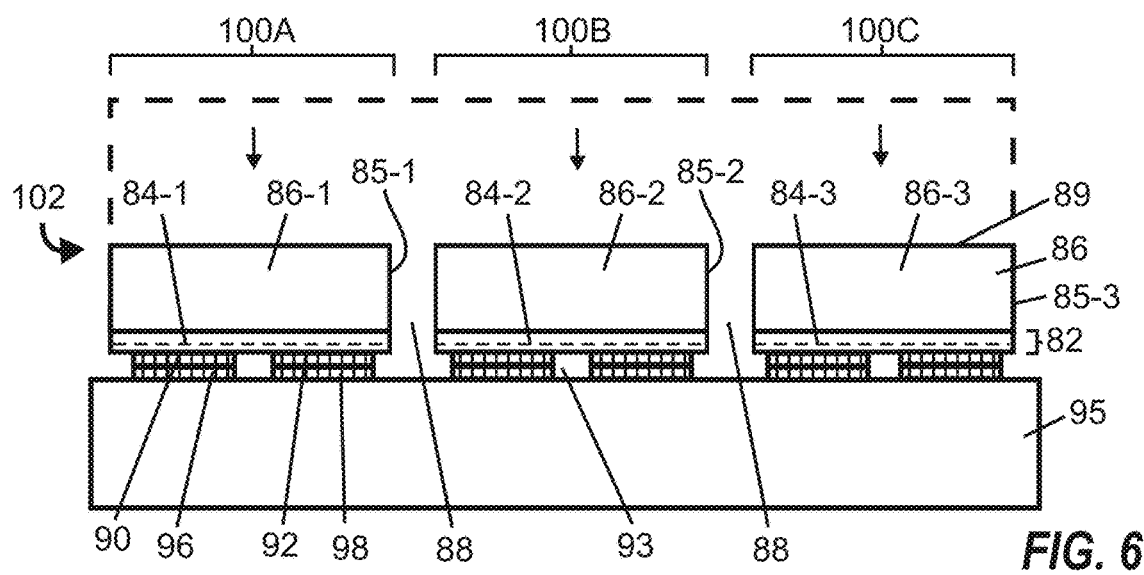

In FIG. 6F, the substrate 86 is subjected to one or more thinning processes to thin an entire upper portion of the substrate 86, in order to create openings into the recesses 88. In certain embodiments, the thinning comprises grinding at a slow rate (e.g., at a thickness removal rate of 0.1 µm per second for a SiC substrate). Other thinning processes such as grinding, lapping, and mechanical polishing may be additionally or alternatively be used. In certain embodiments, the substrate 86 may initially comprise a thickness of greater than 300 µm. After mounting the substrate 86 to the submount 95, the substrate 86 may be thinned to a thickness of no more than 170 µm, no more than 150 µm, no more than 120 µm, or no more than 100 µm. In some embodiments, the substrate 86 may be thinned to about 50 µm, about 30 µm, about 15 µm, or about 10 µm, by one or more thinning steps. A desirable substrate thickness may depend in part on the substrate material. Sapphire is less brittle than silicon carbide, such that a desirable sapphire substrate thickness may be greater (e.g., in a range of 100 µm to 170 µm) than a desirable thickness of a silicon carbide substrate (e.g., in a range of 15 µm to 120 µm, or a suitable subrange thereof). Generally, a thinner substrate 86 may confer better optical properties to a resulting light emitting device. The thinning process may be terminated when the thickness of the substrate 86 is less than or equal to the initial depth of the recesses 88 so that openings into the recesses 88 are formed, with an outer surface 89 of the substrate 86 serving as a light extraction surface. The substrate 86 is thereby segregated into a plurality of discontinuous substrate portions 86-1 to 86-3 that are registered with corresponding active layer portions 84-1 to 84-3 to form a pixelated-LED chip 102 comprising a plurality of pixels 100A, 1008, and 100C. Each substrate portion 86-1 to 86-3 is bounded by a sidewall 85-1 to 85-3 of the corresponding pixel 100A-100C, with the sidewalls 85-1 to 85-3 forming lateral boundaries of the recesses 88 (which embody inter-pixel spaces). Spaces 93 are also provided between the anode-cathode pairs 90, 92, as well as between the electrode pairs 96, 98, in an area between the active region 82 and a surface 94 of the submount 95. The streets 88 and the spaces 93 are subject to being filled with one or more underfill materials, and one or more lumiphoric materials may be arranged on or over the pixels 100A-100C, as described hereinafter.

Figure 6G:
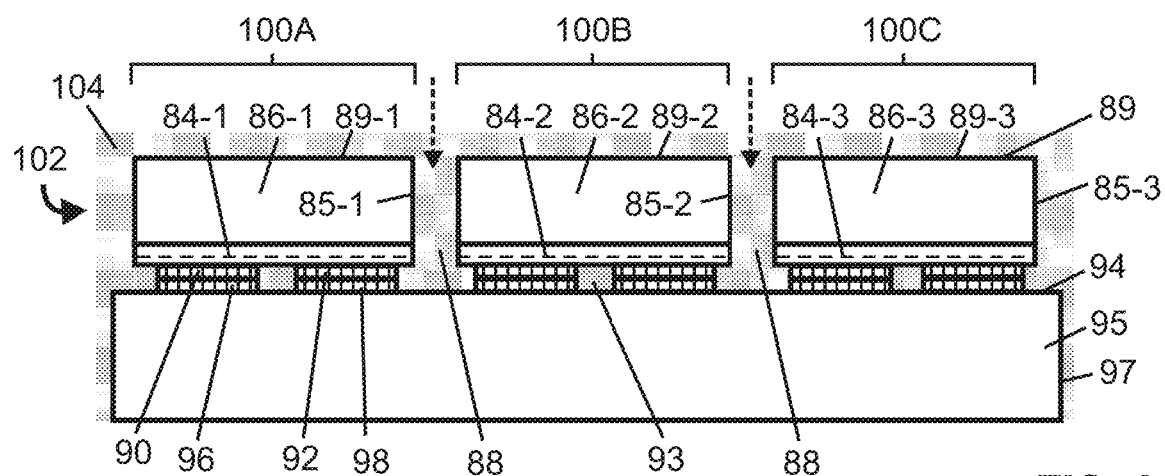

FIG. 6G illustrates the pixelated-LED chip 102 mounted over the submount 97 following application of an underfill material 104 from a top side of the pixelated-LED chip 102 into the recesses 88, as depicted by the dashed arrows. The underfill material 104 may be applied in a flowable form through the recesses 88 to contact sidewalls 85-1 to 85-3 of the pixels 100A-100C, and to contact the anode-cathode pairs 90, 92 and electrode pairs 96, 98 as well as spaces 93 therebetween. The underfill material 104 may also contact an upper surface 94 (and optionally, sidewalls 97) of the submount 95. As shown, the underfill material 104 may overlap the light extraction surfaces 89-1 to 89-3 of the pixels 100A-100C.

In certain embodiments, the pixelated-LED chip 102 and underfill material 104 may be inserted into a pressure vessel (not shown) and subjected to elevated pressure conditions (e.g., clean dry air or nitrogen at a pressure within a range of 40 psi to 80 psi (2.76 bar to 5.52 bar), or within a range of 50 psi to 70 psi (3.45 bar to 4.83 bar) for several minutes in order to shrink any air bubbles initially present within the underfill material 104. This shrinkage of air bubbles may allow sidewalls 85-1 to 85-3 of the pixels 100A-100C to be more uniformly wetted with underfill material 104 supplied in a previous step. Optionally, the elevated pressure conditions may be provided in an autoclave (i.e., a heated pressure vessel, such as a pressurizable oven), whereby the underfill material 104 may be pressurized and thermally cured simultaneously.

Figure 6H:
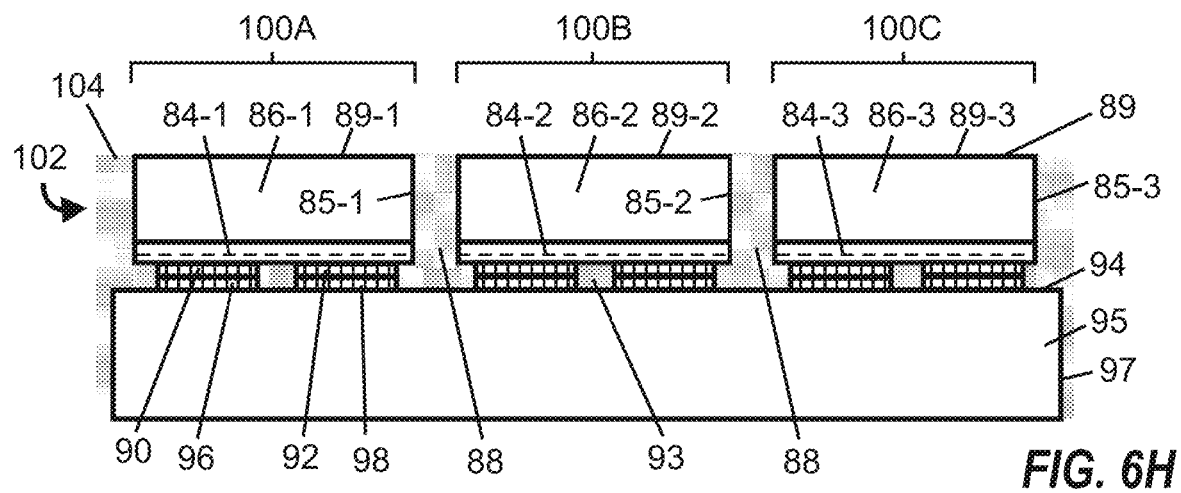

FIG. 6H shows the pixelated-LED chip 102 and submount 97 of FIG. 6G following removal of an excess upper portion of underfill material 104 in order to expose the light extraction surfaces 89-1 to 89-3 of the pixels 100A-100C. In certain embodiments, the underfill material 104 is applied in a flowable form, and an excess upper portion of the underfill material 104 is removed by wiping with a cleanroom cloth, such as a woven nylon cloth (e.g., commercially available from Texwipe, Kernersville, NC, USA). As shown in FIG. 6H, in certain embodiments, removal of an excess upper portion of the underfill material 104 may yield an upper surface 105 of the underfill material 104 that is substantially flush (coplanar) with the light extraction surfaces 89-1 to 89-3 of the pixels 100A-100C. If desired, the underfill material 104 may be cured in this configuration by suitable curing methods such as photonic, thermal, and/or chemical means, optionally while the pixelated-LED chip 102 is subjected to an elevated pressure condition in a suitable pressure vessel.

Figure 6I:
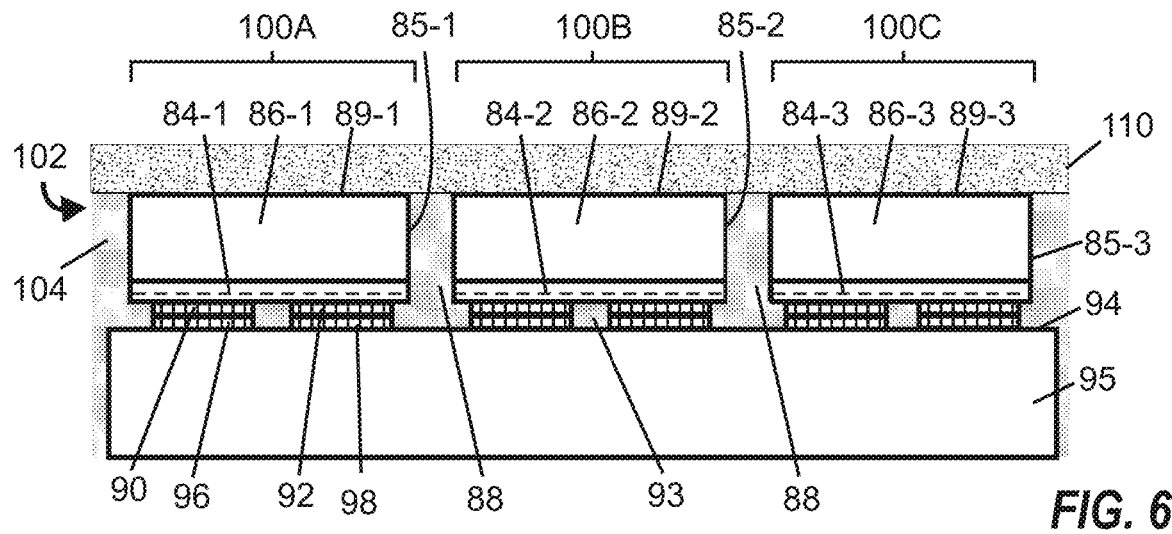

FIG. 6I shows the pixelated-LED chip 102 and submount 95 assembly of FIG. 6H following application of a lumiphoric material 110 over the pixelated-LED chip 102. As shown, the lumiphoric material 110 may be arranged in contact with light extraction surfaces (e.g., faces) 89-1 to 89-3 of the pixels 100A-100C and with the underfill material 104. In certain embodiments, the lumiphoric material 110 may be applied in a flowable form and subsequently cured. In certain embodiments, the lumiphoric material 110 may be provided in solid form (e.g., a film, a predefined substrate, etc.). Because the light extraction surfaces 89-1 to 89-3 are devoid of macrotextural features, and are substantially flat and flush with the second underfill material 108, the layer of lumiphoric material 110 applied thereover may have a uniform thickness, such as with a thickness variation of less than 500 nm over an entire thickness of all light extraction surfaces 89-1 to 89-3, thereby promoting uniform light emissions from all areas of the pixelated-LED chip 102. In certain embodiments, the lumiphoric material 110 may be applied over the pixelated-LED chip 102, and one or more curing steps may be performed simultaneously on the lumiphoric material 110 and underlying underfill material 104.

In certain embodiments, involutions defined in substrate sidewalls may have a lateral spacing in a range of 0.2 μm to 5 μm, or 0.5 μm to 5 μm, or 1 μm to 5 μm, or any other desired spacing. In certain embodiments, at least some sidewall involutions of the plurality of sidewall involutions may be present in an amount of at least 1, at least 2, at least 3, at least 4, or at least 5, involutions per micrometer of substrate sidewall length. In certain embodiments, one or more sidewall involutions may have dimensions that vary with distance away from a primary face of a substrate. In certain embodiments, at least some sidewall involutions of the plurality of sidewall involutions extend at least 0.25 μm, at least 0.5 μm, or at least 1 μm into a substrate sidewall in a direction perpendicular to a length of the substrate sidewall at a midpoint height of the substrate sidewall.

In certain embodiments, when viewed from above, involutions defined in a substrate sidewall may resemble a sawtooth shape, a square multi-toothed shape, a wavy shape, or any other desired shape. In certain embodiments, involutions defined in substrate sidewalls may be substantially aligned in a direction generally parallel to a height direction of the substrate sidewall and/or in a direction perpendicular to a primary face of a substrate.

Involutions defined in substrate sidewalls may yield inset portions that alternate with projecting portions of sidewalls that confer increased surface area, thus providing a plurality of non-coplanar surface portions of a substrate sidewall. In certain embodiments, each substrate sidewall comprises a plurality of non-coplanar surface portions that confer a sidewall surface area at least 20% greater, at least 30% greater, at least 50% greater, at least 75% greater, or in a range of 20% to 100% greater, or in a range of 50% to 150% greater, than a comparable substrate sidewall of the same length and height dimensions but devoid of non-coplanar surface portions.

Figure 7A:
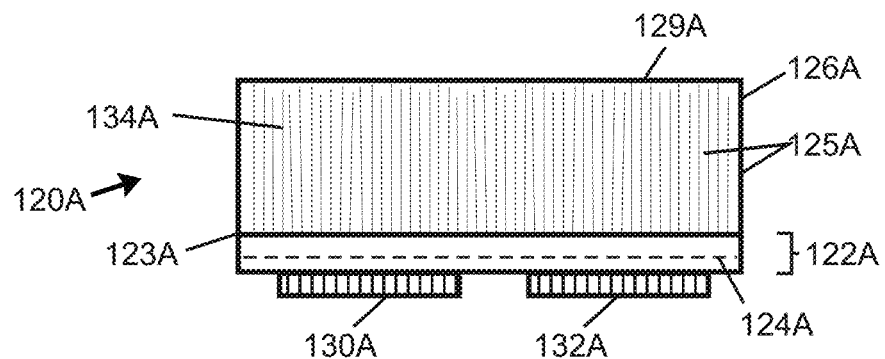
FIGS. 7A-7C are schematic side elevational views of LED chips having substrate sidewalls with involutions and/or increased sidewall surface area regions according to certain embodiments.
Figure 7B:
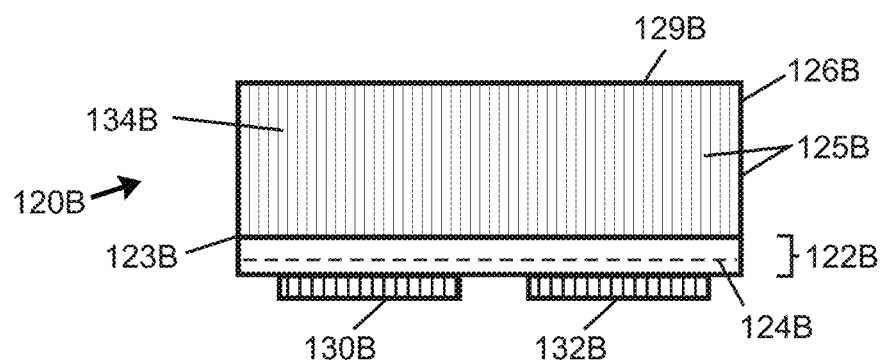
Figure 7C:
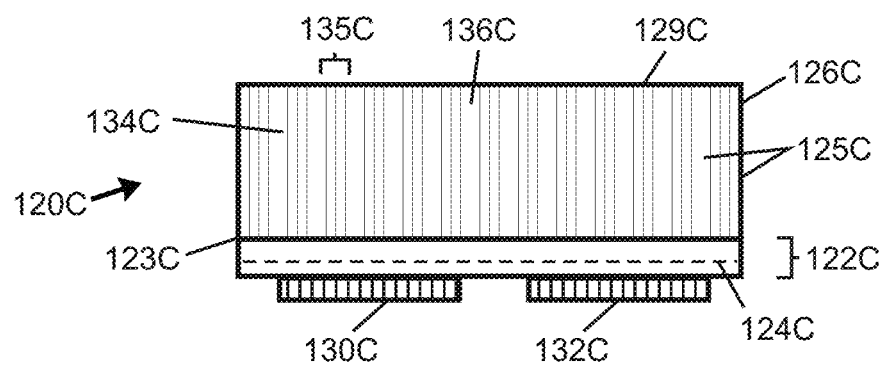

FIGS. 7A-7C are schematic side elevational views of LED chips having substrate sidewalls with involutions and/or increased sidewall surface area regions according to certain embodiments.

FIG. 7A shows a LED chip 120A having a substrate 126A supporting a LED structure 122A with an active region 124A. An anode 130A and a cathode 132A are in electrical communication with the active region 124A. The substrate 126A comprises a light-transmissive material, and includes a primary face 129A and sidewalls 125A that may emit light generated by the active region 124A. The sidewalls 125A include involutions 134A that extend in a direction that is parallel to a height direction of the sidewalls 125, and that is substantially perpendicular to the primary face 129A. As shown, the involutions 134A defined in the sidewalls 125A of the substrate 126A may be substantially parallel, but not perfectly parallel to one another. In certain embodiments, at least some involutions 134A may extend along the sidewalls 125A an entire distance from the primary face 129A to an opposing face 123A of the substrate 126A (wherein the opposing face 123A may comprise a boundary between the substrate 126A and the LED structure 122A). As shown in FIG. 7A, in certain embodiments, one or more involutions 134A may extend along the sidewalls 125A less than an entire distance from the primary face 129A to the opposing face 123A of the substrate 126A. In certain embodiments, at least some involutions 134A may be substantially equally spaced along a width of one or more sidewalls 125A. In certain embodiments, at least some or all of the involutions 134A may be unevenly spaced along a width of one or more sidewalls 125A.

FIG. 7B shows a LED chip 120B having a substrate 126B supporting a LED structure 122B with an active region 124B. An anode 130B and a cathode 132B are in electrical communication with the active region 124B. The substrate 126B comprises a light-transmissive material, and includes a primary face 129B and sidewalls 125B that may emit light generated by the active region 124B. The sidewalls 125B include involutions 134B that extend in a direction substantially perpendicular to the primary face 129B, and substantially parallel to a height direction of the sidewalls 125B. As shown in FIG. 7B, the involutions 134B defined in the sidewalls 125B of the substrate 126B may be substantially parallel, substantially evenly spaced, and may span an entire distance from the primary face 129B to an opposing face 123B of the substrate 126B. In certain embodiments, the involutions 134B may be defined by etching using a etch mask having non-linear patterned edges.

FIG. 7C shows a LED chip 120C having a substrate 126C supporting a LED structure 122C with an active region 124C. An anode 130C and a cathode 132C are in electrical communication with the active region 124C. The substrate 126C comprises a light-transmissive material, and includes a primary face 129C and sidewalls 125C that may emit light generated by the active region 124C. The sidewalls 125C include involutions 134C that extend in a direction substantially perpendicular to the primary face 129C, and substantially parallel to a height direction of the sidewalls 125C. As shown in FIG. 7C, the involutions 134C may be arranged in involution groups 135C that alternate with regions 136C that are devoid of involutions. The involutions 134C defined in the sidewalls 125C of the substrate 126C may be substantially parallel and may span an entire distance from the primary face 129C to an opposing face 123C of the substrate 126C. In certain embodiments, the involutions 134C may be defined by etching using a etch mask having non-linear patterned edges (e.g., as described hereinafter).

Figure 8A:
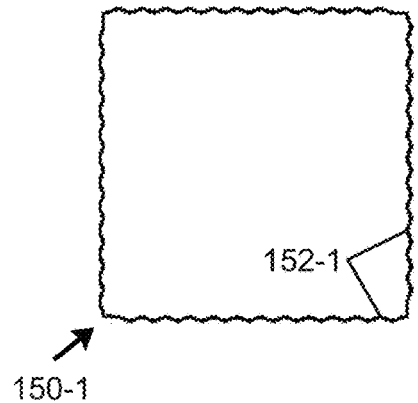
FIG. 8A is a schematic top plan view of at least a portion of an etch mask having edges of a first non-linear shape.

FIG. 8A is a schematic top plan view of at least a portion of a first etch mask 150-1 having edges 152-1 of a non-linear shape. As shown, the etch mask 150-1 has a roughly rectangular shape with the edges 152-1 having an undulating or wavy shape. When the etch mask 150-1 is applied over a portion of a substrate of a LED chip that is exposed to a suitable etchant, the edges 152-1 may establish a corresponding pattern of involutions along etched sidewalls of a substrate of the LED chip.

Figure 8B:
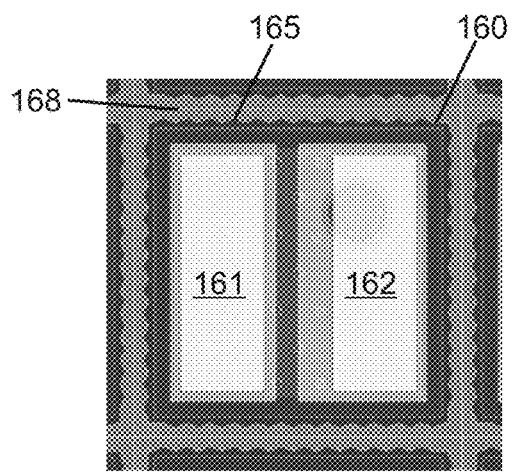
FIG. 8B is a schematic top plan view of a portion of a pixelated-LED chip having etched substrate sidewalls with repeating wavy non-linear shapes corresponding to the edge shapes of the mask portion of FIG. 8A.

FIG. 8B is a schematic top plan view of a portion of a pixelated-LED chip 160 having etched substrate sidewalls 165 with repeating, wavy non-linear shapes corresponding to shapes of the non-linear edges 152-1 of the etch mask portion 150-1 of FIG. 8A. As shown in FIG. 8B, the substrate sidewalls 165 are bounded by recesses 168 that form a grid, and an anode 161 and cathode 162 of one pixel of the LED chip 160 are laterally inset relative to the substrate sidewalls 165.

Figure 9A:
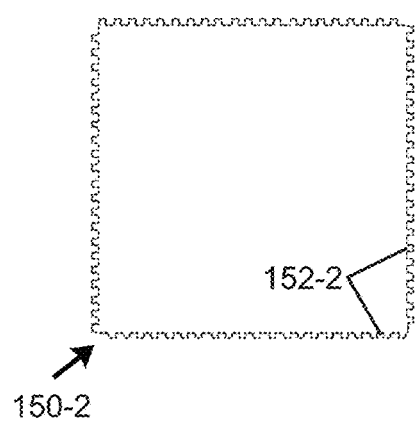
FIG. 9A is a schematic top plan view of at least a portion of an etch mask having edges of a second non-linear shape.

FIG. 9A is a schematic top plan view of at least a portion of a second etch mask 150-2 having edges 152-2 of another non-linear shape. As shown, the etch mask 150-2 has a roughly rectangular shape with the edges 152-2 having a repeating, square-tooth shape. When the etch mask 150-2 is applied over a portion of a substrate of a LED chip that is exposed to a suitable etchant, the edges 152-2 may establish a corresponding pattern of involutions along etched sidewalls of a substrate of the LED chip.

Figure 9B:
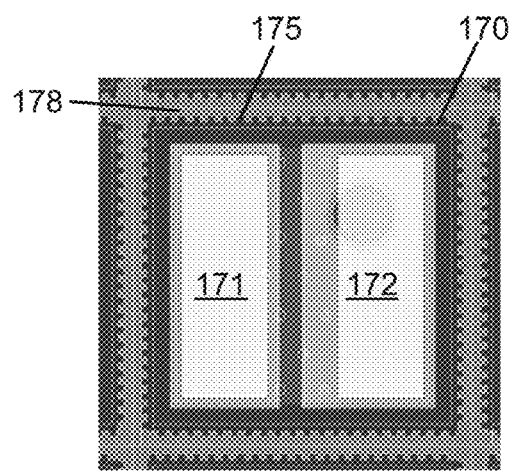
FIG. 9B is a schematic top plan view of a portion of a pixelated-LED chip having etched substrate sidewalls with repeating rectangular tooth-like non-linear shapes of a first pitch, corresponding to the edge shapes of the mask portion of FIG. 9A.

FIG. 9B is a schematic top plan view of a portion of a pixelated-LED chip 170 having etched substrate sidewalls 175 with repeating, square-toothed non-linear shapes corresponding to shapes of the non-linear edges 152-2 of the etch mask portion 150-2 of FIG. 8A. As shown in FIG. 9B, the substrate sidewalls 175 are bounded by recesses 178 that form a grid, and an anode 171 and cathode 172 of one pixel of the LED chip 170 are laterally inset relative to the substrate sidewalls 175.

Figure 10:
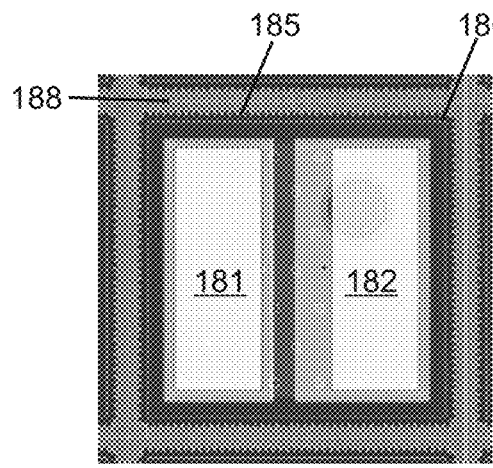
FIG. 10 is a schematic top plan view of a portion of a pixelated-LED chip having etched substrate sidewalls with repeating sawtooth non-linear shapes.

FIG. 10 is a schematic top plan view of a portion of a pixelated-LED chip 180 having etched substrate sidewalls 185 with repeating, sawtooth non-linear shapes that may be formed by etching using an etch mask (not shown) with corresponding edge shapes. As shown, the substrate sidewalls 185 are bounded by recesses 188 that form a grid, and an anode 181 and cathode 182 of one pixel of the LED chip 180 are laterally inset relative to the substrate sidewalls 185.

Figure 11:
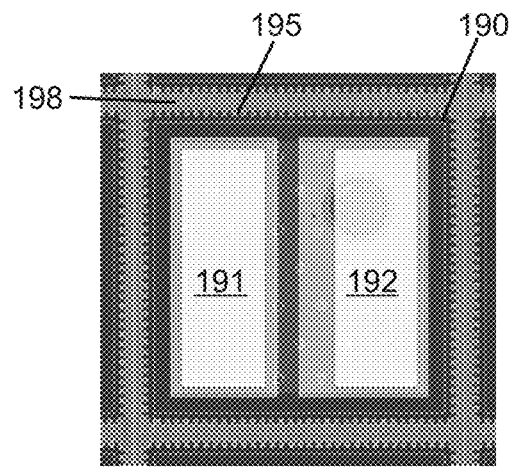
FIG. 11 is a schematic top plan view of a portion of a pixelated-LED chip having etched substrate sidewalls with repeating rectangular tooth-like non-linear shapes of a first pitch.

FIG. 11 is a schematic top plan view of a portion of a pixelated-LED chip 190 having etched substrate sidewalls 195 with repeating square-tooth shapes (of a smaller pitch than shown in FIG. 9B) that may be formed by etching using an etch mask (not shown) with corresponding edge shapes. As shown, the substrate sidewalls 195 are bounded by recesses 198 that form a grid, and an anode 191 and cathode 192 of one pixel of the LED chip 190 are laterally inset relative to the substrate sidewalls 195.

Figure 12A:
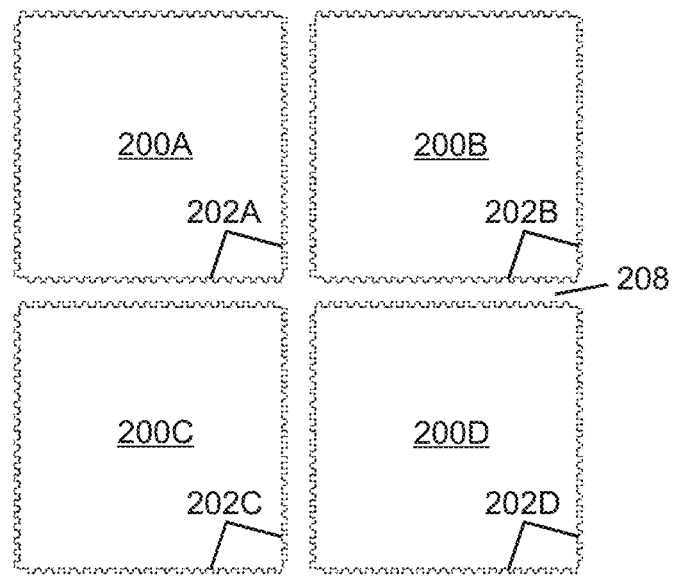
FIG. 12A is a schematic top plan view of at least a portion of an etch mask having four discontinuous mask regions each having edges of a non-linear shape.

FIG. 12A is a schematic top plan view of at least a portion of an etch mask 200 having four discontinuous mask regions 200A-200D each having edges 202A-202D of a non-linear shape. As shown, the mask regions 200A-200D are substantially rectangular in shape, while the edges 202A-202D have a repeating square-tooth shapes and are separated by gaps 208 that form a grid and that will correspond to outlines of recesses to be formed by etching a substrate over which the etch mask 200 is applied.

Figure 12B:
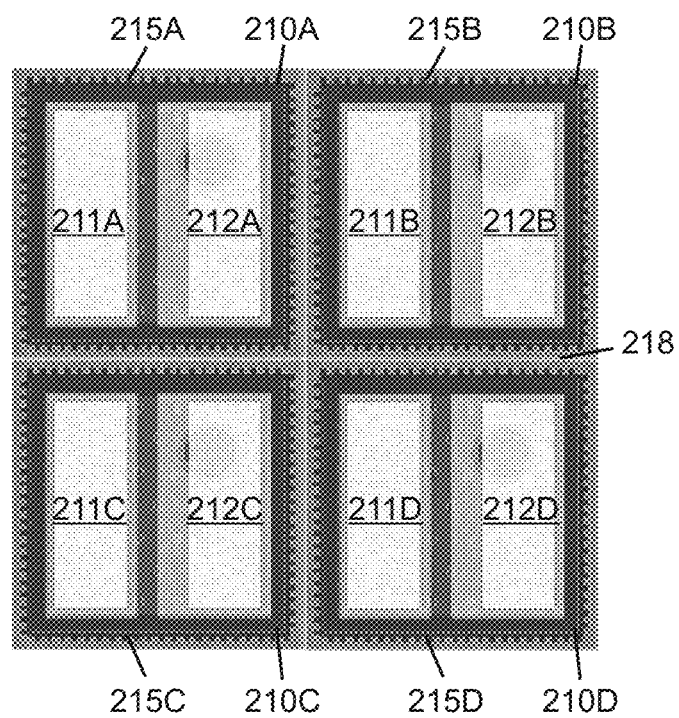
FIG. 12B is a schematic top plan view of at least a portion of a pixelated-LED chip including four pixel regions each having etched substrate sidewalls with repeating rectangular tooth-like non-linear shapes corresponding to edge shapes of the mask regions of FIG. 12A.

FIG. 12B is a schematic top plan view of at least a portion of a pixelated-LED chip 209 including four pixel regions 210A-210D each having etched substrate sidewalls 215A-215D with repeating rectangular tooth-like non-linear shapes that correspond to shape of non-linear edges 202A-202D of the mask regions 200A-200D of FIG. 12A. As shown, the substrate sidewalls 215A-215D are bounded by intersecting recesses 218 that form a grid, with anodes 211A-211D and cathodes 212A-212D the pixel regions 210A-210D being laterally inset relative to the substrate sidewalls 215A-215D.

Figure 13:
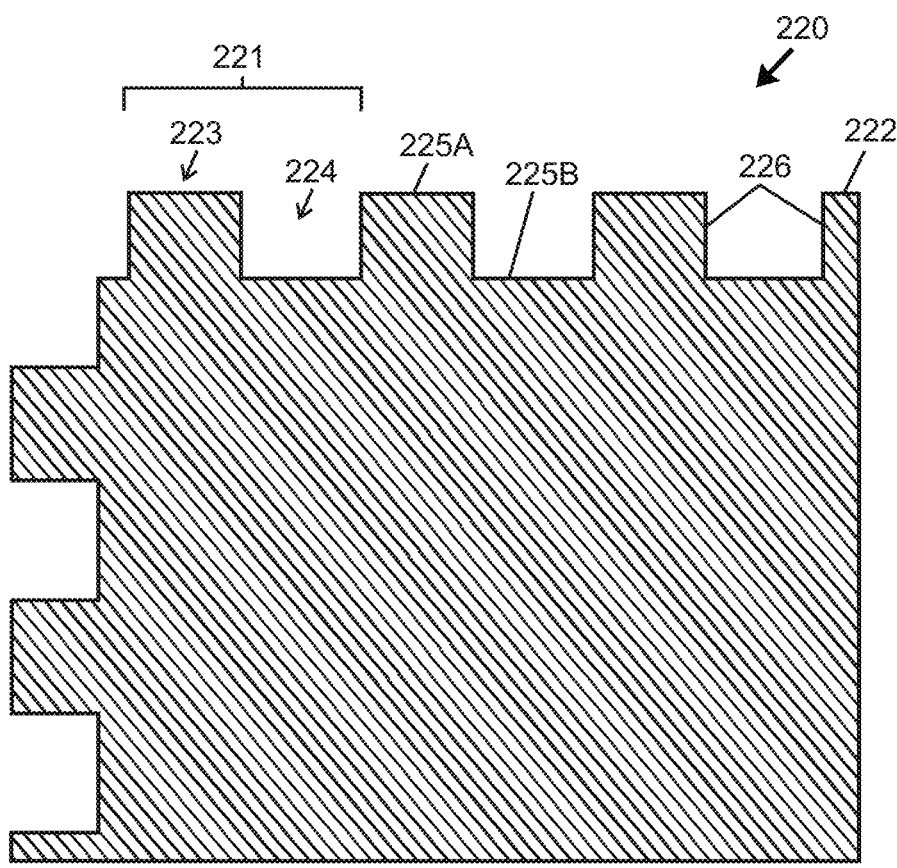
FIG. 13 is a magnified schematic top plan view of a corner portion of an etch mask having edges of a repeating square-tooth, non-linear shape.

FIG. 13 is a magnified schematic top plan view of a corner portion of an etch mask 220 having edges 222 of a repeating square-tooth, non-linear shape. The edges 222 include involution regions 221 composed of alternating projecting portions 223 and inset portions 224. Each involution region 221 may include wall-parallel surfaces 225A, 225B and wall-perpendicular surfaces 226. When the etch mask 220 is used to form recesses in a substrate bounded by substrate walls corresponding in shape to the edges 222, involutions are formed in substrate sidewalls corresponding to the involution regions 221 of the etch mask 220, and the presence of wall-perpendicular surface portions of substrate sidewalls serves to increase a surface area of each substrate sidewall relative to a substrate sidewall of a comparable length and height lacking any involution regions 221. In certain embodiments, a substrate sidewall may comprises a plurality of non-coplanar surface portions that confer a sidewall surface area at least 20% greater, at least 30% greater, at least 50% greater, at least 75% greater, or in a range of 20% to 100% greater, than a comparable substrate sidewall of the same length and height dimensions but devoid of non-coplanar surface portions.

FIGS. 14A-22 provide scanning electron microscope (SEM) images of portions of pixelated-LED chips having substrate sidewalls with involutions defined therein.

Figure 14A:
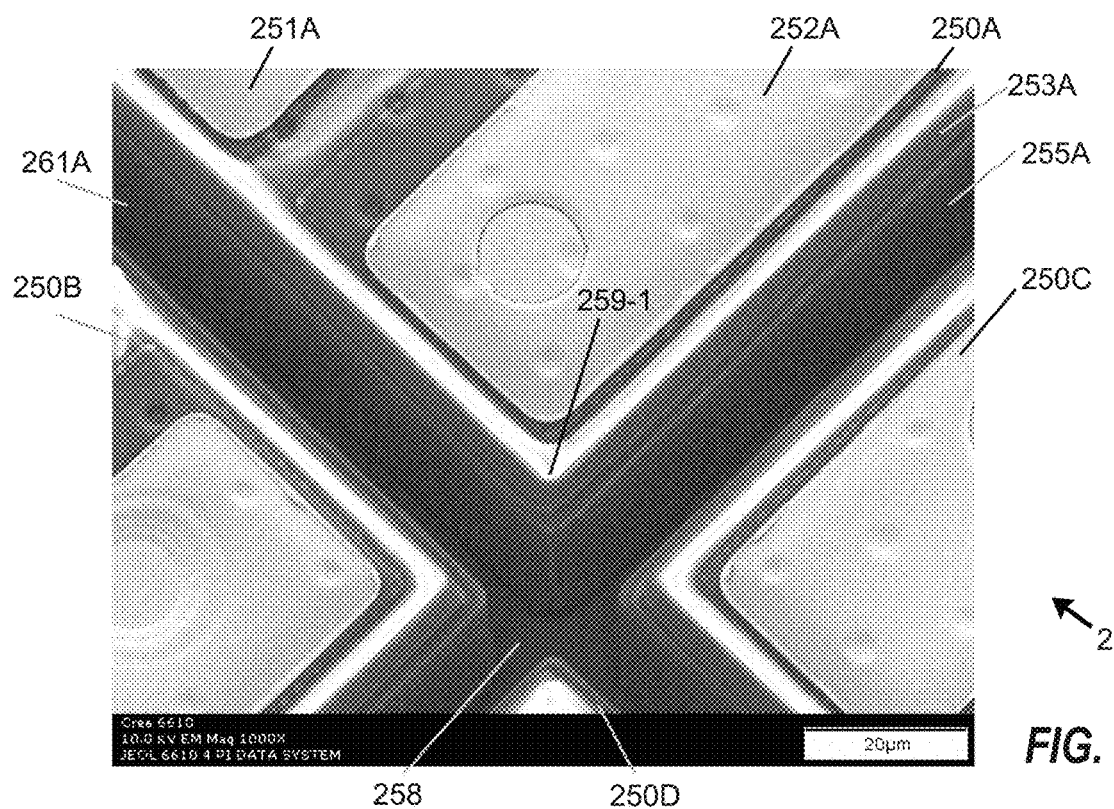
FIG. 14A is a 1000× magnification scanning electron microscope (SEM) image of a first portion of a first pixelated-LED chip (showing corners of adjacent pixels) including substrate sidewalls with involutions that are oriented in a substantially vertical direction.
Figure 14B:
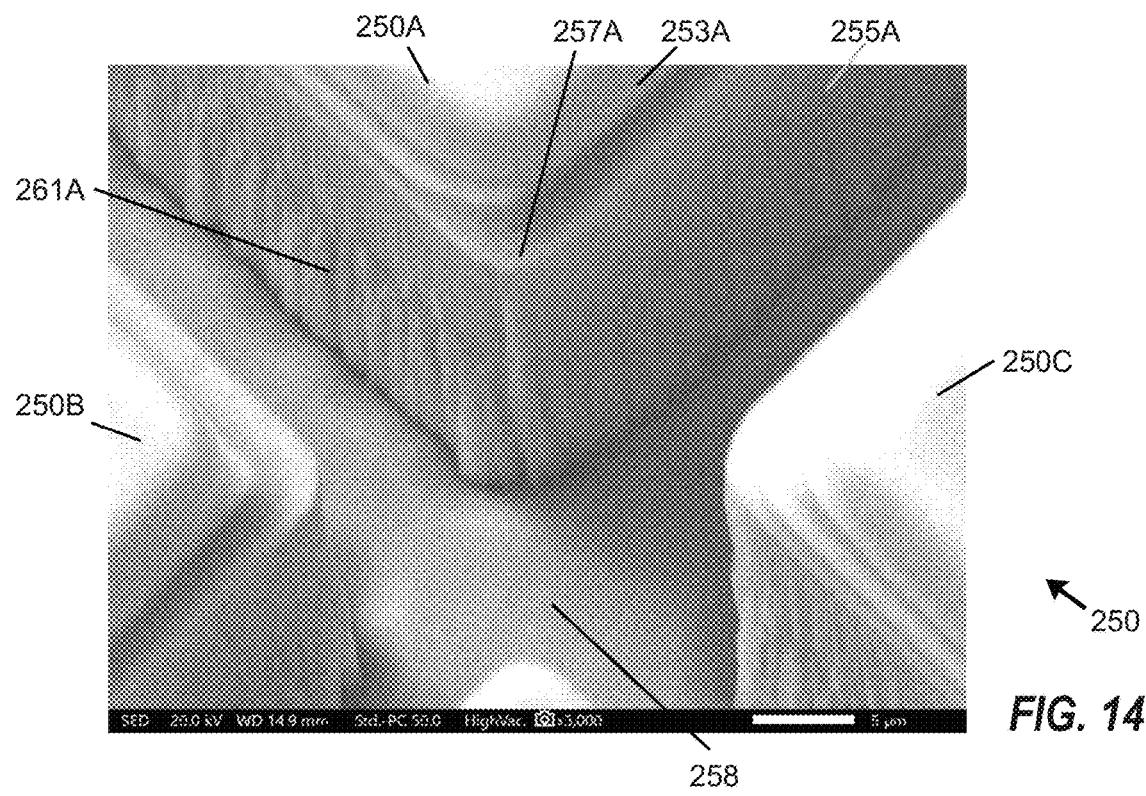
FIG. 14B is a 3000× magnification portion of the image shown in FIG. 14A.

FIG. 14A is a 1000× magnification scanning electron microscope (SEM) image of a first portion of a first pixelated-LED chip 250 (showing corners of adjacent pixels 250A-250D with substantially vertical involutions defined in sidewalls thereof), with particular focus on the first pixel 250A. The first pixel 250A includes substrate sidewalls 255A with involutions 261A that are oriented in a substantially vertical direction. As shown, the first pixel 250A includes an anode 251A and a cathode 252A arranged over a semiconductor structure 253A that is supported by a substrate (which is bounded by substrate sidewalls 255A). Intersecting recesses 258 are provided between adjacent pixels 250A-250D and are bounded by sidewalls of adjacent substrates (e.g., substrate sidewalls 255A). A first corner 295-1 of the first pixel 250A is shown in FIG. 14A. FIG. 14B is a 3000× magnification portion of the image shown in FIG. 14A, showing involutions 261A defined in substrate sidewalls 255A of the first pixel 250A. As shown, the involutions 261A are oriented in a substantially vertical direction and extend around an entire perimeter of the substrate sidewalls 255A, from a floor of the recesses 258 to an upper surface 257A of the substrate of the first pixel 250A.

Figure 15A:
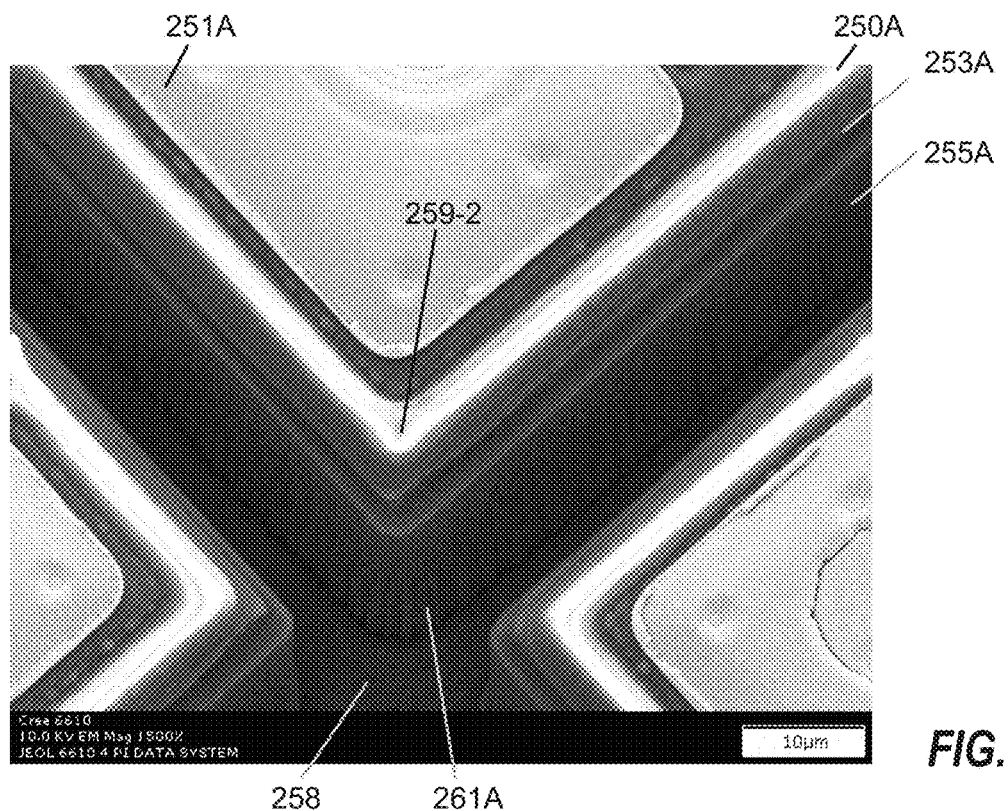
FIG. 15A is a 1500× magnification SEM image of a second portion of the first pixelated-LED chip (showing corners of adjacent pixels) including substrate sidewalls with involutions that are oriented in a substantially vertical direction.
Figure 15B:
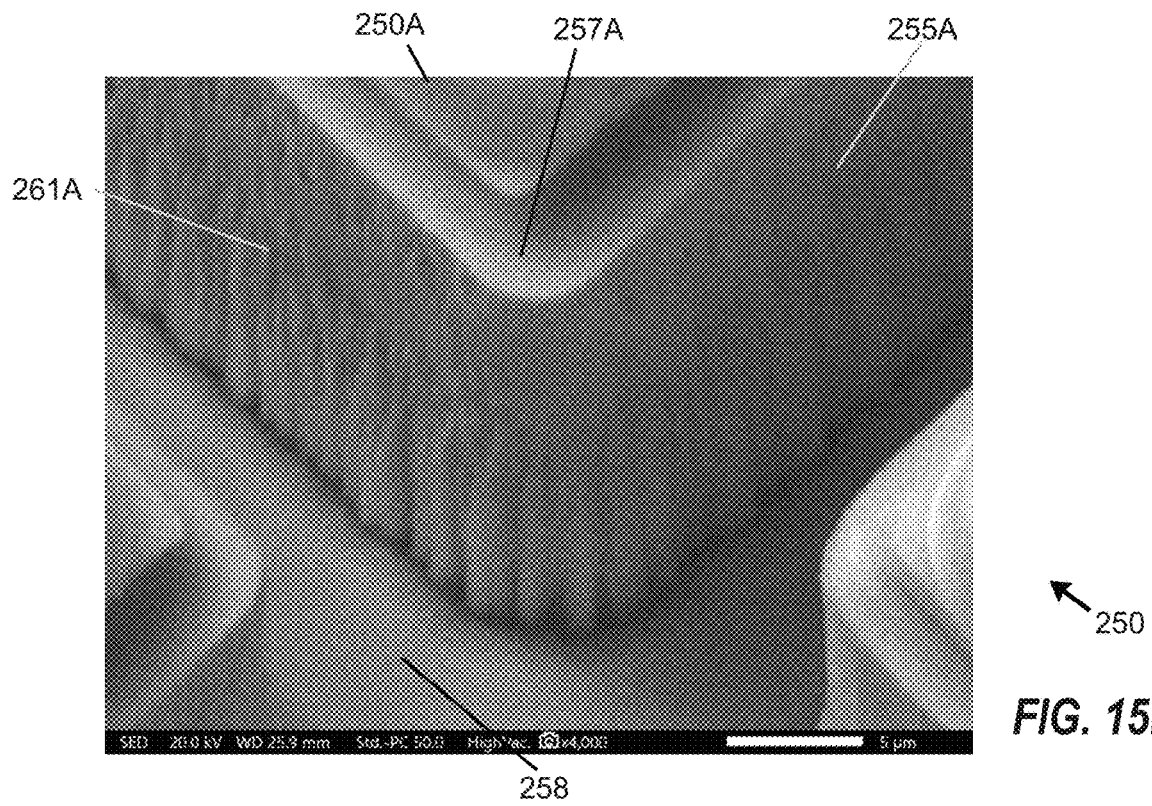
FIG. 15B is a 3000× magnification portion of the image shown in FIG. 15A.

FIG. 15A is a 1500× magnification SEM image of a second portion of the first pixelated-LED chip 250, with particular focus on a second corner 259-2 of the first pixel 250A. Such figure shows the anode 251A, the semiconductor structure 253A, and substrate sidewalls 255A in which multiple involutions 261A extending in a substantially vertical direction are defined. Sidewalls of adjacent pixels (e.g., substrate sidewalls 255A of pixel 250A) define boundaries of recesses 258 that separate the pixels. FIG. 15B is a 3000× magnification portion of the image shown in FIG. 15A, showing involutions 261A defined in substrate sidewalls 255A of the first pixel 250A, oriented in a substantially vertical direction and extending around an entire perimeter of the substrate sidewalls 255A, from a floor of the recesses 258 to an upper surface 257A of the substrate of the first pixel 250A.

Figure 16A:
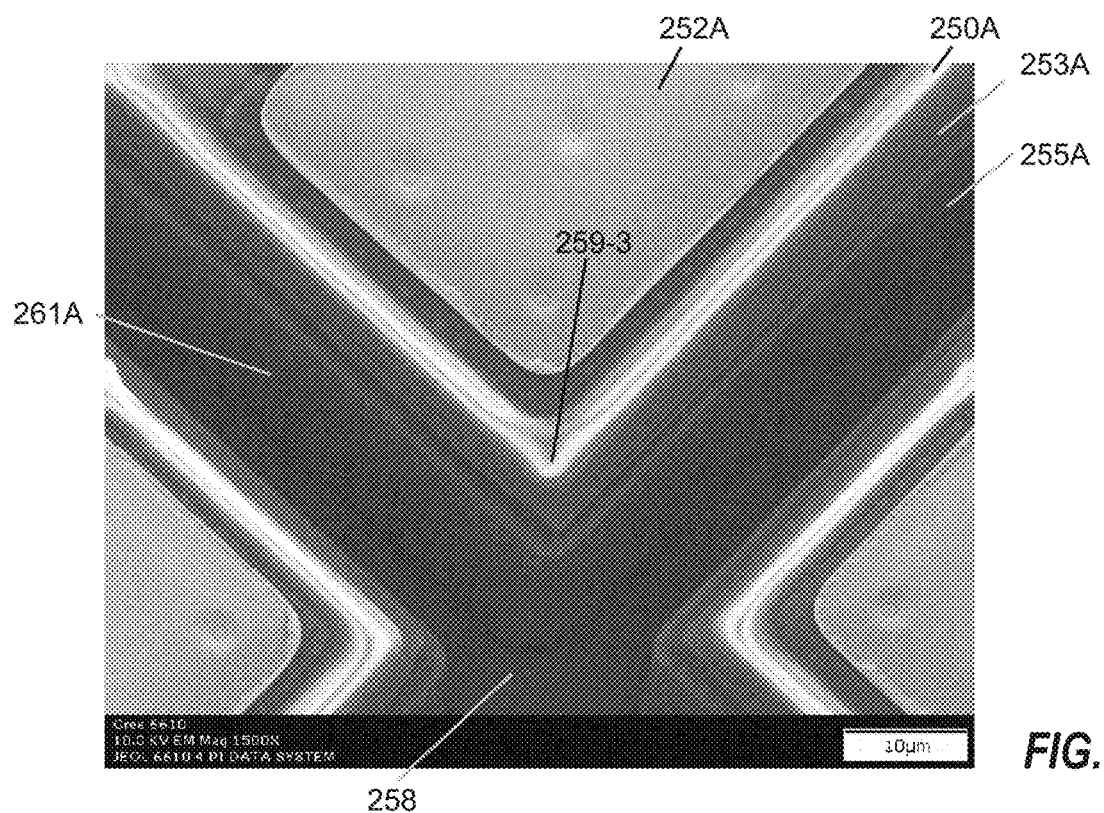
FIG. 16A is a 1500× magnification SEM image of a third portion of the first pixelated-LED chip (showing corners of adjacent pixels) including substrate sidewalls with involutions that are oriented in a substantially vertical direction.
Figure 16B:
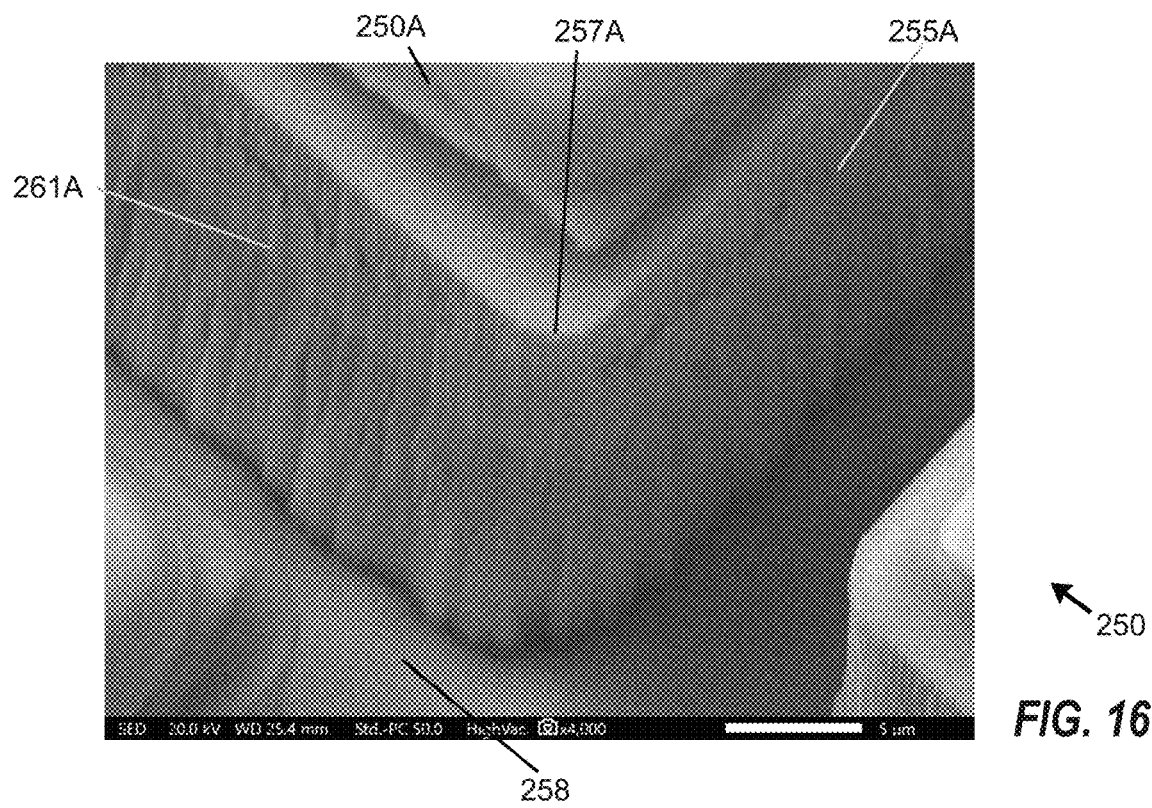
FIG. 16B is a 3000× magnification portion of the image shown in FIG. 16A.

FIG. 16A is a 1500× magnification SEM image of a third portion of the first pixelated-LED chip 250, with particular focus on a third corner 259-3 of the first pixel 250A. Such figure shows the cathode 252A, the semiconductor structure 253A, and substrate sidewalls 255A in which multiple involutions 261A extending in a substantially vertical direction are defined. Sidewalls of adjacent pixels (e.g., substrate sidewalls 255A of pixel 250A) define boundaries of recesses 258 that separate the pixels. FIG. 16B is a 3000× magnification portion of the image shown in FIG. 16A, showing involutions 261A defined in substrate sidewalls 255A of the first pixel 250A, and oriented in a substantially vertical direction and extending around an entire perimeter of the substrate sidewalls 255A, from a floor of the recesses 258 to an upper surface 257A of the substrate of the first pixel 250A.

Figure 17A:
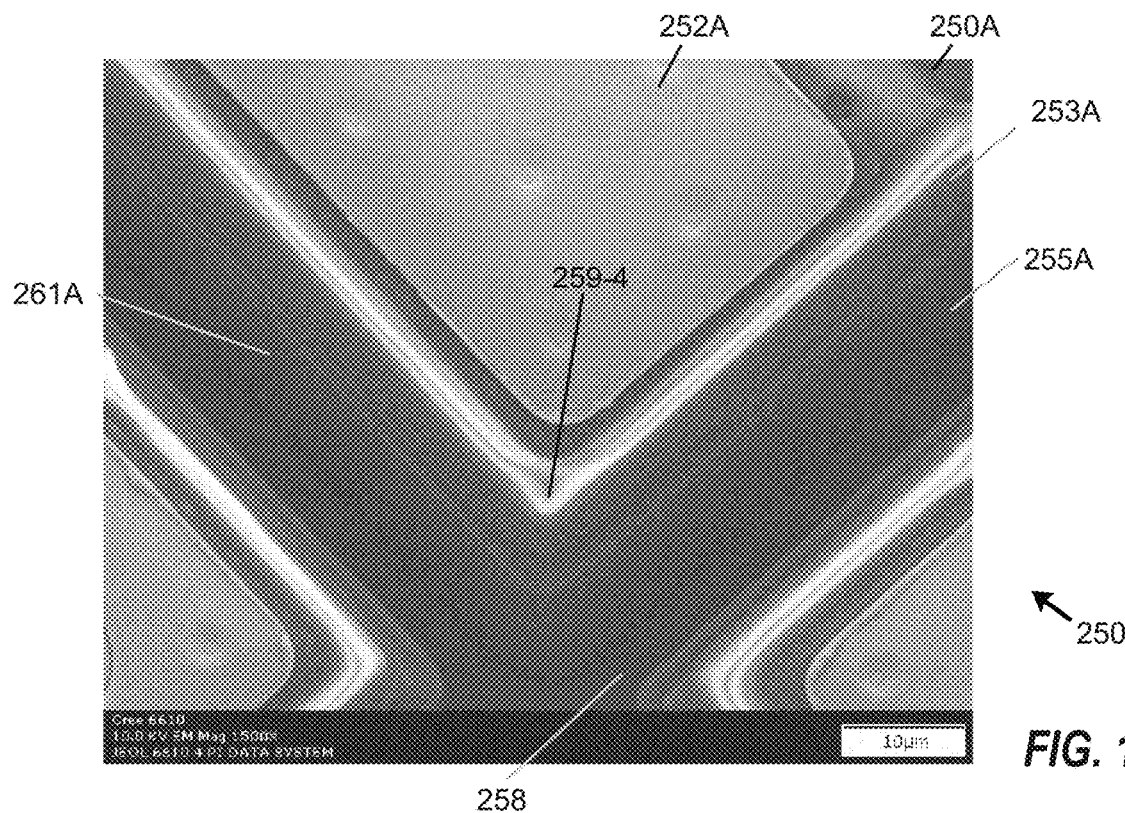
FIG. 17A is a 1500× magnification SEM image of a fourth portion of the first pixelated-LED chip (showing corners of adjacent pixels) including substrate sidewalls with involutions that are oriented in a substantially vertical direction.
Figure 17B:
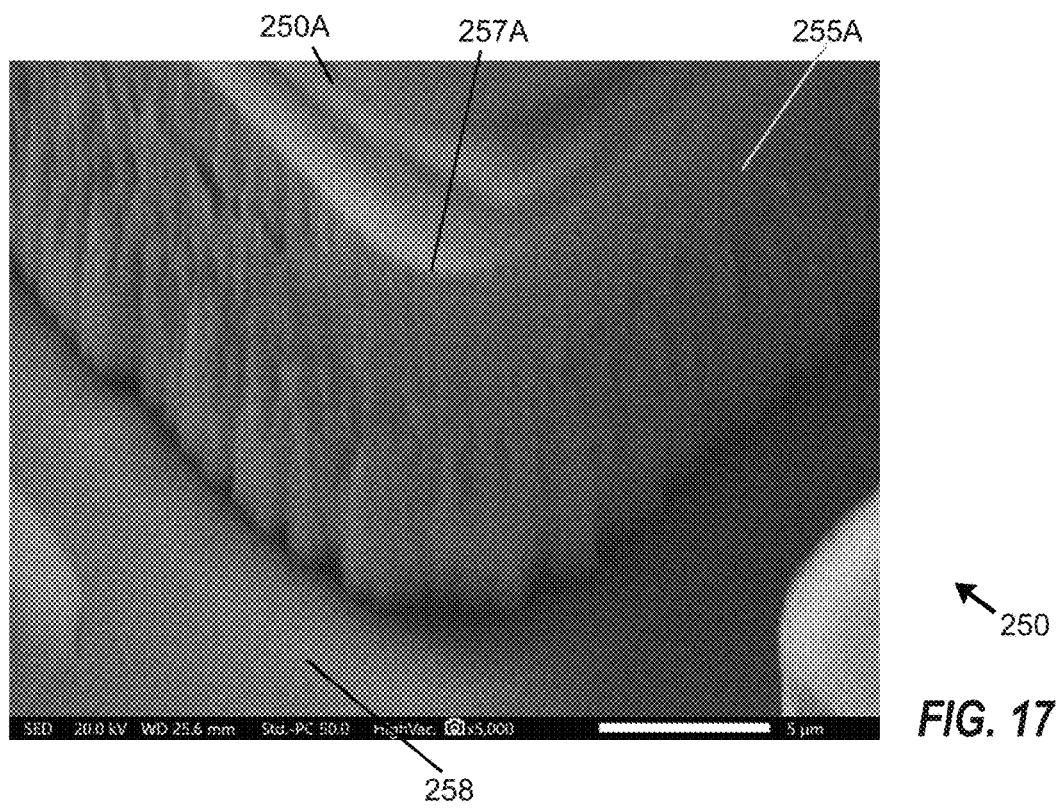
FIG. 17B is a 3000× magnification portion of the image shown in FIG. 17A.

FIG. 17A is a 1500× magnification SEM image of a third portion of the first pixelated-LED chip 250, with particular focus on a fourth corner 259-4 of the first pixel 250A. Such figure shows the cathode 252A, the semiconductor structure 253A, and substrate sidewalls 255A in which multiple involutions 261A extending in a substantially vertical direction are defined. Sidewalls of adjacent pixels (e.g., substrate sidewalls 255A of pixel 250A) define boundaries of recesses 258 that separate the pixels. FIG. 17B is a 3000× magnification portion of the image shown in FIG. 17A, showing involutions 261A defined in substrate sidewalls 255A of the first pixel 250A, and oriented in a substantially vertical direction and extending around an entire perimeter of the substrate sidewalls 255A, from a floor of the recesses 258 to an upper surface 257A of the substrate of the first pixel 250A.

Figure 18A:
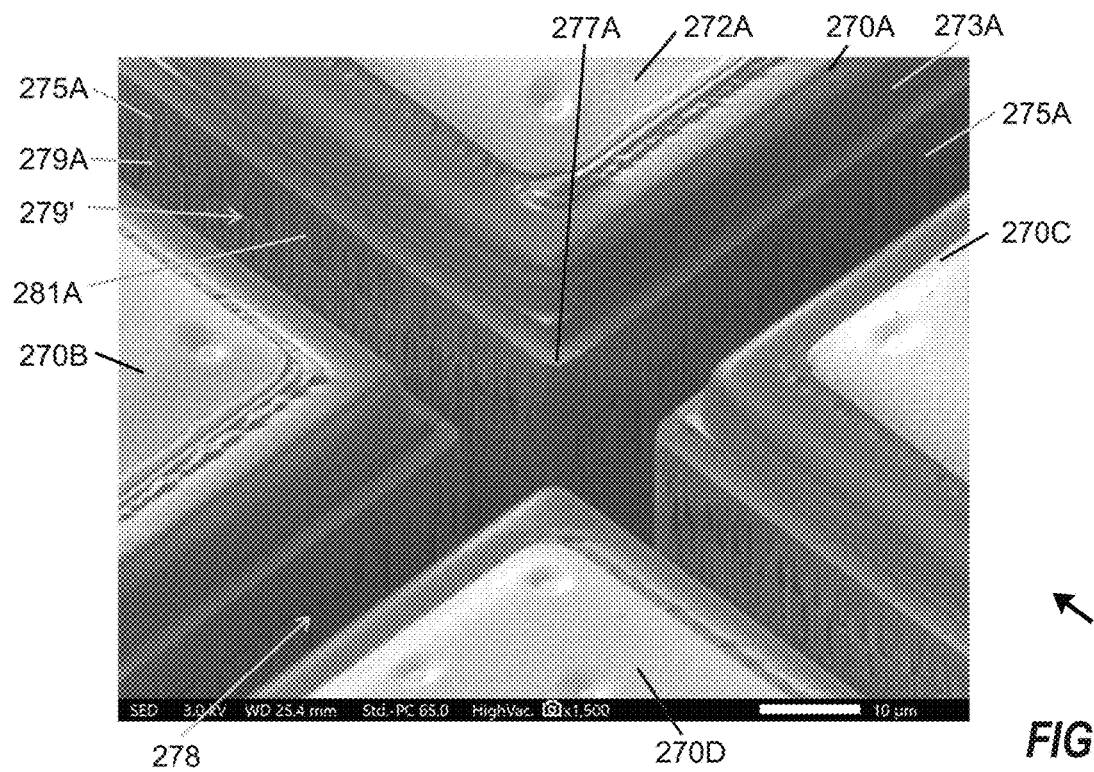
FIG. 18A is a 1500× magnification SEM image of a portion of a second pixelated-LED chip (showing corners of adjacent pixels) including substrate sidewalls with involutions that are oriented in a substantially vertical direction, and showing thin shield wall portions arranged on selected substrate sidewalls.
Figure 18B:
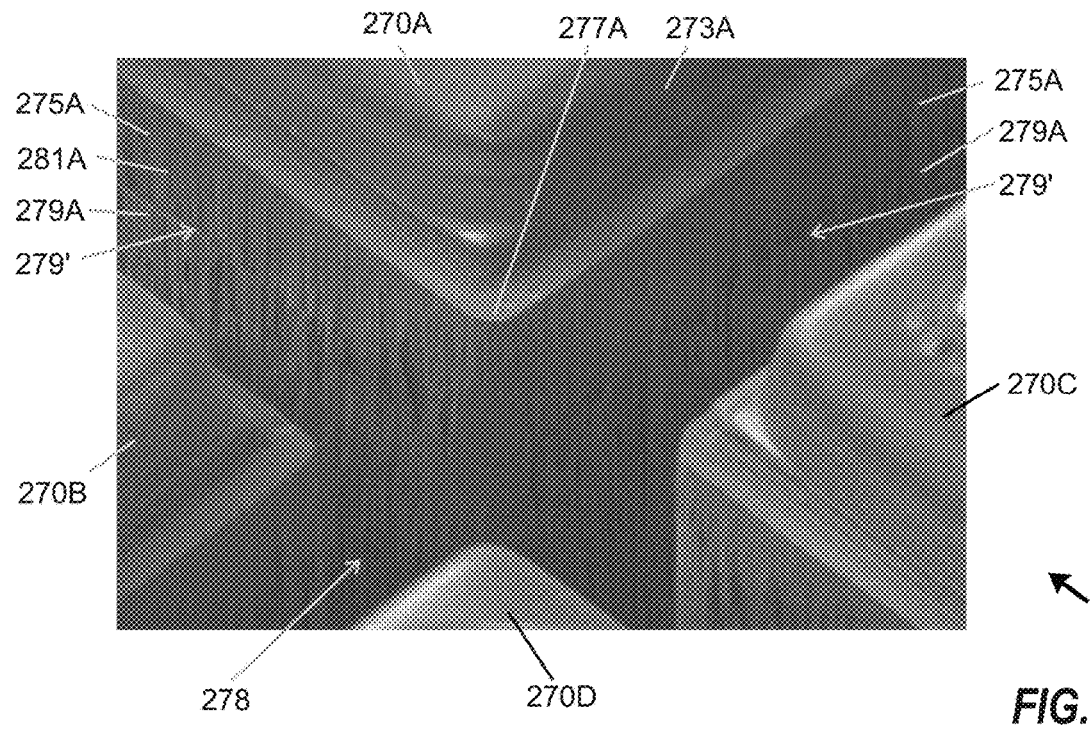
FIG. 18B is an enlarged portion of the image shown in FIG. 18A.

FIG. 18A is a 1500× magnification SEM image of a portion of a second pixelated-LED chip 270 (showing corners of adjacent pixels 270A-270D) including substrate sidewalls 275A with involutions 281A that are oriented in a substantially vertical direction, and showing thin shield wall portions 279A arranged on selected substrate sidewalls 275A. FIG. 18B is a magnified central portion of FIG. 18A. As shown, a cathode 272A is arranged over a semiconductor structure 273A that is supported by a substrate that is bounded by substrate sidewalls 275A. Intersecting recesses 278 are provided between adjacent pixels 270A-270D and are bounded by sidewalls of adjacent substrates (e.g., substrate sidewalls 275A). The thin shield wall portions 279A extent vertically in a direction parallel with the substrate sidewalls 275A, and include vertically oriented involutions defined therein. The shield wall portions 279A are observed to typically exhibit upper boundaries exhibit upper boundaries 279 below an upper surface 277A of a substrate. In certain embodiments, the shield wall portions 279A affect transmission of light exiting a substrate by attenuating some portion of light that would otherwise exit substrate sidewalls 275 if the shield wall portions 279A were absent. In certain embodiments, an upper boundary 279' of a shield wall portion 279A may have a substantially constant height; in other embodiments, an upper boundary 279' of a shield wall portion 279A may have an uneven height (e.g., with variation of 5 or more, 10 or more, or 20 or more microns, around at least a portion of a substrate sidewall 275A.

Figure 19:
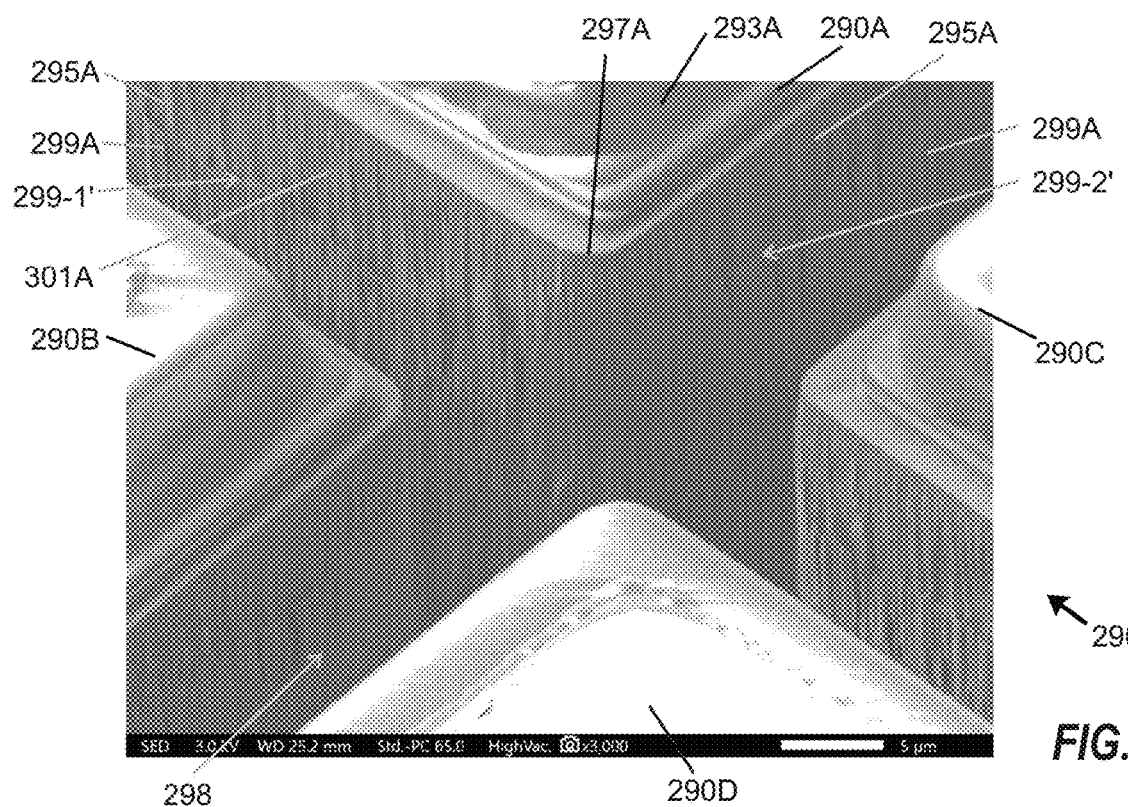
FIGS. 19 and 20 are 3000× magnification SEM images of portions of additional pixelated-LED chips (showing corners of adjacent pixels) including substrate sidewalls with involutions that are oriented in a substantially vertical direction, and showing thin shield wall portions arranged on selected substrate sidewalls.

FIG. 19 is a 3000× magnification SEM image of a portion of another pixelated-LED chip 290 (showing corners of adjacent pixels 290A-290D) including substrate sidewalls 295A with involutions 301A that are oriented in a substantially vertical direction, and showing thin shield wall portions 299A arranged on selected substrate sidewalls 295A. As shown, a semiconductor structure 293A is supported by a substrate that is bounded by substrate sidewalls 295A. Intersecting recesses 298 are provided between adjacent pixels 290A-290D and are bounded by sidewalls of adjacent substrates (e.g., substrate sidewalls 295A). The involutions 301A extend around an entire perimeter of the substrate sidewalls 295A, to a height along an upper surface 297A of the substrate of the first pixel 290A. The thin shield wall portions 299A extend vertically in a direction parallel with the substrate sidewalls 295A, and include vertically oriented involutions defined therein. The shield wall portions 299A include upper boundaries (299-1', 299-2') arranged at a height below that of an upper surface of a substrate of the pixels 290A-290D (e.g., upper surface 297A of the first pixel 290A). At left in FIG. 19, the upper boundary 299-1' of a shield wall portion 299A exhibits a nearly constant height over a portion of a width of the substrate sidewall 295A. At right in FIG. 19, the upper boundary 299-2' of a shield wall portion 299A exhibits more substantial variation in height.

Figure 20:
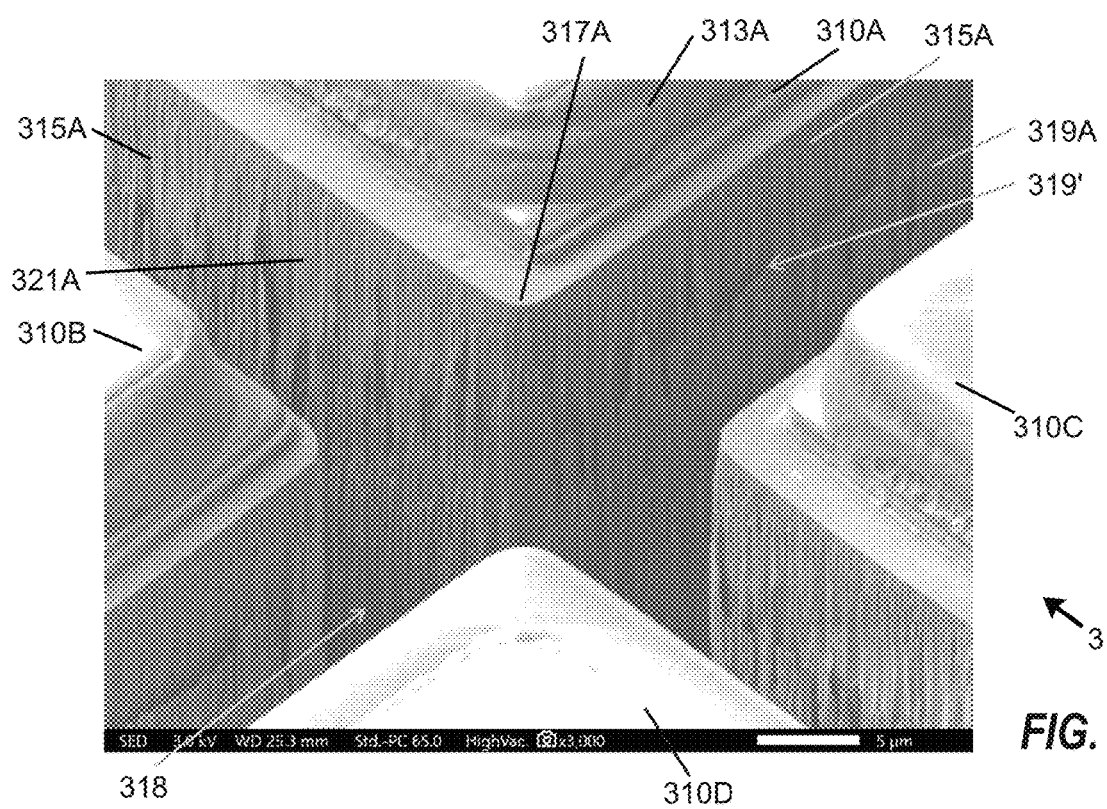

FIG. 20 is a 3000× magnification SEM image of a portion of another pixelated-LED chip 310 (showing corners of adjacent pixels 310A-310D) including substrate sidewalls 315A with involutions 321A that are oriented in a substantially vertical direction, and showing thin shield wall portions 319A arranged on selected substrate sidewalls 315A. As shown, a semiconductor structure 313A is supported by a substrate that is bounded by substrate sidewalls 315A. Intersecting recesses 318 are provided between adjacent pixels 310A-310D and are bounded by sidewalls of adjacent substrates (e.g., substrate sidewalls 315A). The involutions 321A extend around an entire perimeter of the substrate sidewalls 315A, to a height along an upper surface 317A of the substrate of the first pixel 310A. The thin shield wall portions 319A are arranged parallel with the substrate sidewalls 315A, and include vertically oriented involutions defined therein.

Figure 21:
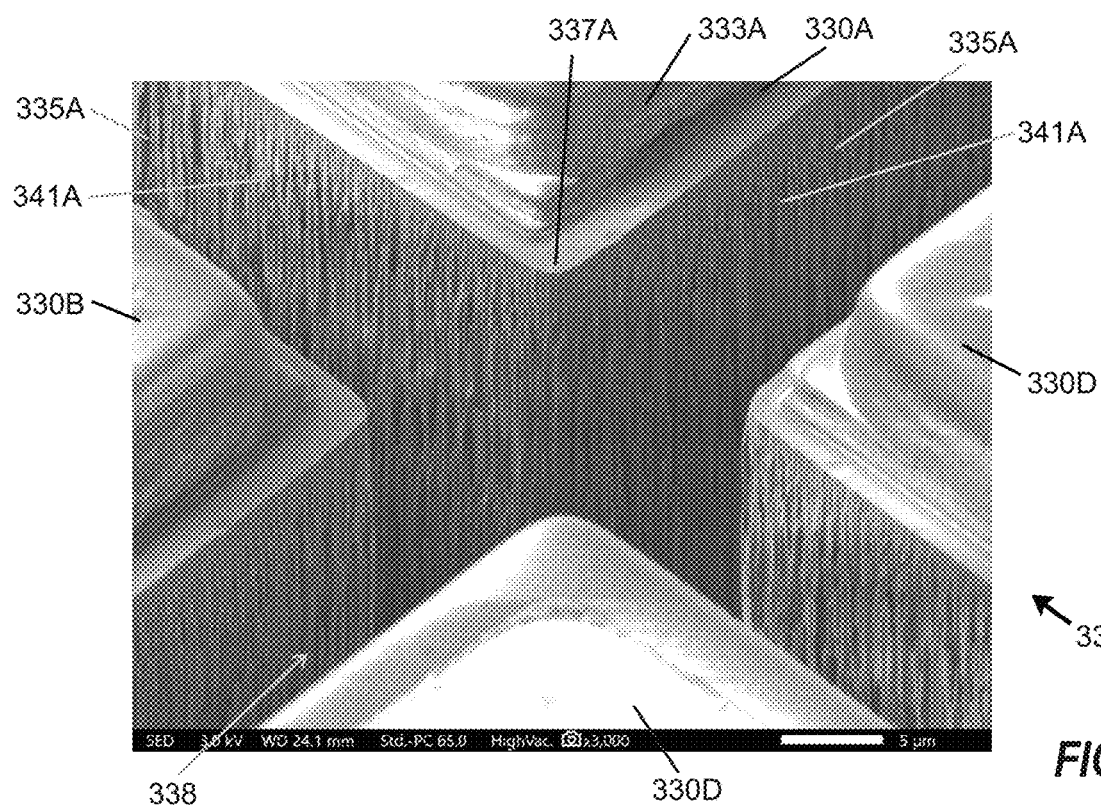
FIG. 21 is a 3000× magnification SEM image of portion of an additional pixelated-LED chip (showing corners of adjacent pixels) including substrate sidewalls with involutions that are oriented in a substantially vertical direction.

FIG. 21 is a 3000× magnification SEM image of a portion of another pixelated-LED chip 330 (showing corners of adjacent pixels 330A-330D) including substrate sidewalls 335A with involutions 341A that are oriented in a substantially vertical direction. The involutions 341A extend around an entire perimeter of the substrate sidewalls 335A, to a height along an upper surface 33A of the substrate of the first pixel 330A. As shown, a semiconductor structure 333A is supported by a substrate that is bounded by substrate sidewalls 335A. Intersecting recesses 338 are provided between adjacent pixels 330A-330D and are bounded by sidewalls of adjacent substrates (e.g., substrate sidewalls 335A). As compared to prior figures, FIG. 21 shows involutions 331 having greater depth (i.e., in a direction perpendicular to the height thereof).

Figure 22:
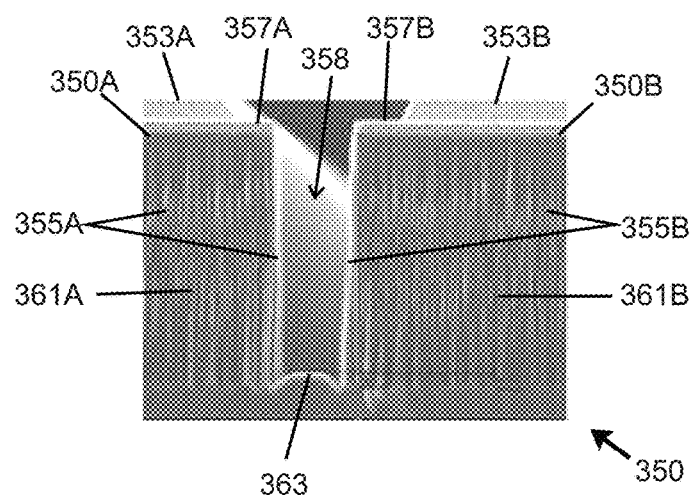
FIG. 22 is a SEM image of a cross-sectional portion of a pixelated-LED chip showing substrate sidewalls of adjacent pixels and a floor between two sidewalls.

FIG. 22 is a SEM image of a cross-sectional portion of a pixelated-LED chip 359 showing portions of two adjacent pixels 350A, 350B, with a floor 363 and a recess 358 arranged between substrate sidewalls 355A, 355B of the pixels 350A, 350B. Involutions 361A, 361B are defined in the substrate sidewalls 355A, 355B and extend from the floor 363 of the recess 358A to upper surfaces 357A, 357B of the substrate portions bounded by the substrate sidewalls 355A, 355B, wherein semiconductor structures 353A, 353B are arranged along the upper surfaces 357A, 357B. As shown, the substrate sidewalls 355A, 355B are substantially vertical, but are inclined slightly away from vertical, with the floor 363 being slightly narrower than a gap between pixels 350A, 350B along upper surfaces thereof 357A, 357B. Additionally, the floor 363 is slightly convex, in that a center of the floor 363 is higher than edges thereof proximate to the substrate sidewalls 355A, 355B.

In certain embodiments, LED lighting devices incorporate superstrates for supporting lumiphoric material may include superstrate sidewalls with sidewall involutions and/or increased sidewall surface area region, to affect (e.g., enhance) light extraction from light-transmissive superstrate materials. The presence of sidewall involutions (and/or other surface area enhancing features) on sidewalls of a light-transmissive superstrate may enhance light extraction from a LED lighting device. In certain embodiments, sidewall involutions and/or other surface area enhancing features may be formed in sidewalls of a superstrate by etching, in a manner corresponding to methods disclosed herein for forming similar features in sidewalls of a substrate. In certain embodiments, techniques other than etching may be used, such as mechanical cutting or grinding, laser ablation, waterjet cutting, or the like. In certain embodiments, a superstrate may comprise a crystalline material such as silicon carbide, sapphire, silicon, quartz (silicon dioxide), borosilicate; or glass of any kind, or acrylic.

In certain embodiments, each superstrate sidewall comprises a plurality of sidewall involutions that are substantially aligned in a direction generally parallel to a height direction of the superstrate sidewall. In certain embodiments, each superstrate sidewall comprises a plurality of non-coplanar surface portions that confer a sidewall surface area at least 20% greater, at least 30% greater, at least 50% greater, at least 75% greater, or in a range of 20% to 100% greater, or in a range of 50% to 150% greater, than a comparable superstrate sidewall of the same length and height dimensions but devoid of non-coplanar surface portions.

In certain embodiments, involutions defined in superstrate sidewalls may have a lateral spacing in a range of 0.2 μm to 5 μm, or 0.5 μm to 5 μm, or 1 μm to 5 μm, or any other desired spacing. In certain embodiments, at least some sidewall involutions of the plurality of sidewall involutions may be present in an amount of at least 1, at least 2, at least 3, at least 4, or at least 5, involutions per micrometer of superstrate sidewall length. In certain embodiments, one or more sidewall involutions may have dimensions that vary with distance away from a primary face of a superstrate. In certain embodiments, at least some sidewall involutions of the plurality of sidewall involutions extend at least 0.25 μm, at least 0.5 μm, or at least 1 μm into a superstrate sidewall in a direction perpendicular to a length of the superstrate sidewall at a midpoint height of the superstrate sidewall.

In certain embodiments, when viewed from above, involutions defined in a superstrate sidewall may resemble a sawtooth shape, a square multi-toothed shape, a wavy shape, or any other desired shape. In certain embodiments, involutions defined in superstrate sidewalls may be substantially aligned in a direction generally parallel to a height direction of the superstrate sidewall and/or in a direction perpendicular to a primary face of a superstrate.

Involutions defined in superstrate sidewalls may yield inset portions that alternate with projecting portions of sidewalls that confer increased surface area, thus providing a plurality of non-coplanar surface portions of a superstrate sidewall. In certain embodiments, each superstrate sidewall comprises a plurality of non-coplanar surface portions that confer a sidewall surface area at least 20% greater, at least 30% greater, at least 50% greater, at least 75% greater, or in a range of 20% to 100% greater, or in a range of 50% to 150% greater, than a comparable superstrate sidewall of the same length and height dimensions but devoid of non-coplanar surface portions.

In certain embodiments, a primary light extraction face of a superstrate (laterally bounded by superstrate sidewalls) may comprise a microtextured etched surface, comprising a non-repeating irregular textural pattern (e.g., with an average feature depth in a range of from 120 nm to 400 nm, and preferably free of any plurality of equally sized, shaped, and spaced textural features). The microtextured etched surface may be formed by applying a micromask having first and second solid materials of different etching rates over the light extraction surface, and exposing the micromask to an etchant (e.g., via reactive ion etching) to form a microtextured etched surface having a non-repeating, irregular textural pattern. Methods for forming such a surface are disclosed in U.S. Provisional Patent Application No. 63/044,746 as previously mentioned herein.

Lumiphoric materials such as phosphors can be selectively added and/or applied in any desired amount or quantity to light-transmissive (e.g., clear or substantially clear) superstrate material. Application of the lumiphoric material can be achieved via any suitable method including, for example, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including for example as described in U.S. Pat. No. 8,410,679 to Ibbetson et al., and U.S. Pat. No. 8,425,271 to Hussell et al., wherein the disclosures of the foregoing patents are hereby incorporated by reference herein. In certain embodiments, lumiphoric material applied to a transparent solid material is conformal to the shape and/or surface of the underlying solid material, wherein the conformal layer may have a substantially uniform thickness. In certain embodiments, a thickness of the lumiphoric material on the underlying solid material may be in a range of from about 2 µm to about 100 µm.

In certain embodiments, a superstrate material can be at least partially covered with a wavelength conversion component comprising one or more lumiphoric materials, such as one or more layers of phosphor material. In certain embodiments, a superstrate comprising lumiphoric material may be referred to as a phosphor-sapphire hat, or Phos hat.

One advantage of superstrates comprising lumiphoric materials (e.g., Phos hats) is that they enable tenability or adjustability of color point. For example, when spraying, or other appropriate application technique as discussed herein, lumiphoric compounds on a pre-singulated sapphire wafer, this allows the ability to check color in a short time period. Following application of lumiphoric material, a superstrate may be tested, and lumiphoric material may be re-applied as needed to tune in the color point.

FIGS. 23A-23F are schematic cross-sectional views of various states of fabrication of a LED lighting device including etching of trenches into a superstrate followed by addition of lumiphoric material to the superstrate, and addition of the superstrate and lumiphoric material to a subassembly including multiple LED chips.

Figure 23A:
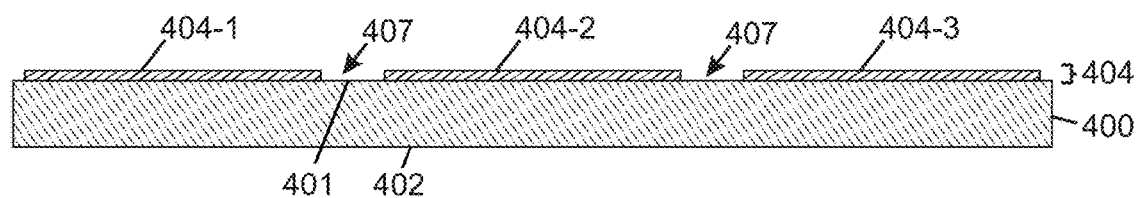
FIGS. 23A-23F are schematic cross-sectional views of various states of fabrication of a LED lighting device including etching of trenches into a superstrate followed by addition of lumiphoric material to the superstrate, and addition of the superstrate and lumiphoric material to a subassembly including multiple LED chips.

FIG. 23A depicts a superstrate material 400 having opposing first and second faces 401, 402 with a patterned etch mask 404 (including multiple etch mask regions 404-1 to 404-3 separated by gaps 407) arranged on the first surface 401. The patterned etch mask 404 may be applied by any suitable method such as photolithographic patterning. In certain embodiments, the superstrate 400 may comprise silicon carbide, the patterned etch mask 404 may comprise copper, and a hydrofluoric acid solution may be used as an etchant. In certain embodiments, the superstrate 400 may comprise sapphire, the patterned etch mask 404 may comprise copper, and a mixture of sulfuric and phosphoric acids may be used as an etchant.

Figure 23B:
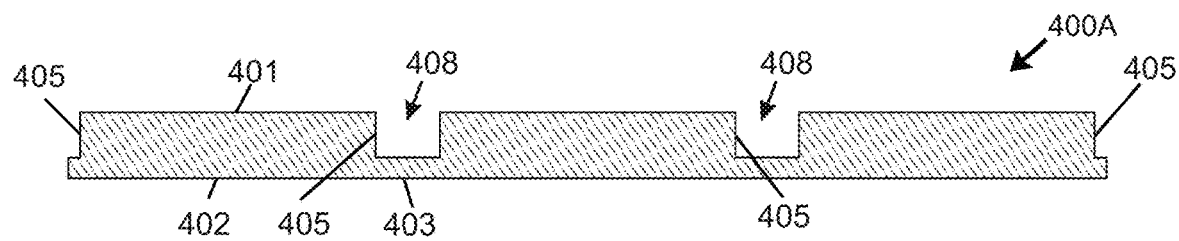

FIG. 23B shows an etched superstrate 400A following exposure of the first face 401 to an etchant through the etch mask 407 of FIG. 23A to consume portions of the superstrate to form recesses 408, and following removal of the etch mask. As shown, the recesses 408 extend in a direction downward from the first face 401 toward the second face 402, with the recesses 408 being bounded from below by a membrane portion 403 of the etched superstrate 400A. The recesses 408 are also bounded laterally by superstrate sidewalls 405, in which involutions (not shown) oriented substantially perpendicular to the first face 401 (i.e., in a substantially vertical direction) may be provided.

Figure 23C:
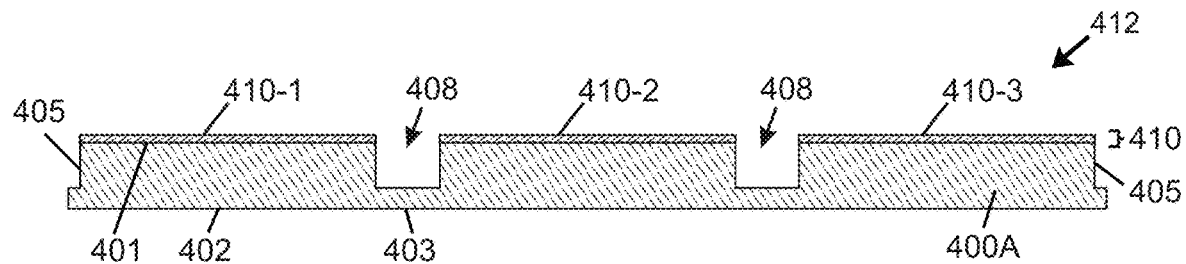

FIG. 23C shows the etched superstrate 400A of FIG. 23B following application of a lumiphoric material 410 over the first surface 401 to produce lumiphoric material regions 410-1 to 410-3, thereby forming a superstrate assembly 412. In certain embodiments, the lumiphoric material 410 does not overlap or penetrate into the recesses 408 (such as by providing a removable material in the recesses 408 to prevent application of lumiphoric material therein), with that the superstrate sidewalls 405 being devoid of lumiphoric material. In certain embodiments, lumiphoric material 410 may be arranged in the recesses 408 and/or in contact with the superstrate sidewalls 405 or the membrane region 403 bounding the recesses 408.

Figure 23D:
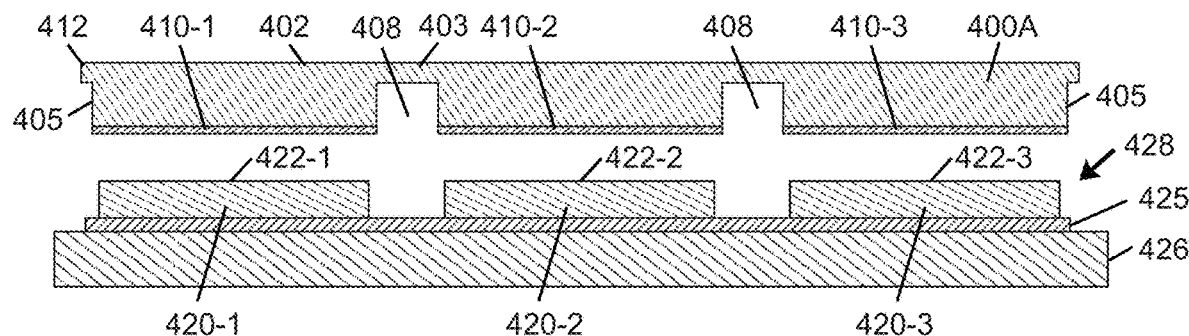

FIG. 23D shows the superstrate assembly 412 of FIG. 23C arranged over and registered with a LED assembly 428 that includes multiple LED regions 420-1 to 420-3 (optionally embodying individual LEDs, LED packages, or individual pixels of a pixelated-LED chip) arranged over conductive traces 425 (which may embody contact pads and/or printed circuit board regions) supported by a substrate 426. Each LED region 420-1 to 420-3 includes at least one active region configured to produce light emissions. As shown, outer faces 422-1 to 422-3 of the LED regions 420-1 to 420-3 are arranged proximate to the lumiphoric material regions 410-1 to 410-3 of the superstrate assembly 412, and recesses 408 of the superstrate assembly 412 are registered with gaps between LED regions 422-1 to 422-3 of the LED assembly 428.

Figure 23E:
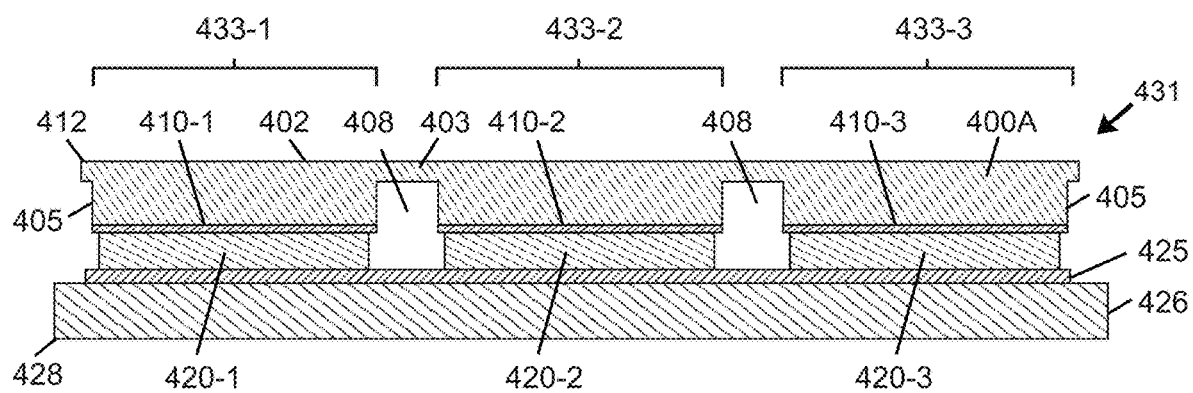

FIG. 23E shows a LED lighting device 431 produced by joining the superstrate assembly 412 and the LED assembly 428 of FIG. 23D, with the lumiphoric material regions 410-1 to 410-3 arranged in contact with the LED regions 420-1 to 420-3, respectively, to form light emitting regions 433-1 to 433-3 (which may be connected by the membrane region 403 of the superstrate assembly 412). In operation, at least part of the light emissions of each LED region 420-1 impinges on a corresponding lumiphoric material region 410-1 to 410-3 and undergoes wavelength conversion. Lumiphor emissions and any unconverted LED emissions are transmitted through superstrate sidewalls 405 and the second face 402 of the etched superstrate 400A to exit the LED lighting device 431. Presence of involutions and/or increased sidewall surface area regions on the superstrate sidewalls 405 may affect (e.g., enhance) light extraction from the light emitting regions 433-1 to 433-3.

In certain embodiments, an etched superstrate assembly may be thinned (e.g., by grinding or other methods) to remove a membrane region. FIG.

Figure 23F:
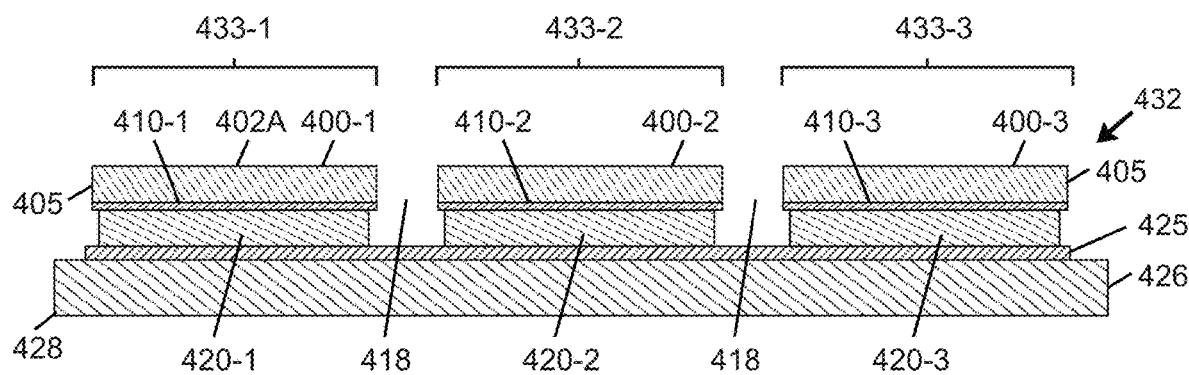

FIG. 23F shows a LED lighting device 432 produced by thinning the etched substrate 400A of FIG. 23E to eliminate the membrane region and form three separate superstrate regions 400-1 to 400-3 each overlying a different LED region 420-1 to 420-3. As shown, each lumiphoric material region 410-1 to 410-3 is arranged between a superstrate region 400-1 to 400-3 and a LED region 420-1 to 420-3, respectively, to form light emitting regions 433-1 to 433-3. In operation, at least part of the light emissions of each LED region 420-1 impinges on a corresponding lumiphoric material region 410-1 to 410-3 and undergoes wavelength conversion. Lumiphor emissions and any unconverted LED emissions are transmitted through superstrate sidewalls 405 and a second face 402A of superstrate regions 400-1 to 400-3 exit the LED lighting device 432. Presence of involutions and/or increased sidewall surface area regions on the sidewalls 405 of the superstrate regions 400-1 to 400-3 may affect (e.g., enhance) light extraction from the light emitting regions 433-1 to 433-3.

Although not shown in FIGS. 23E and 23F, it is to be appreciated that in certain embodiments, one or more light-affecting materials (e.g., lumiphoric material, light scattering material, and/or light reflective material may be deposited in and/or around various portions of light emitting regions 433-1 to 433-3 (e.g., along lateral boundaries of LED regions, a superstrate assembly, and/or superstrate portions) to affect color, color point, and/or directionality of light emissions.

Those skilled in the art will recognize improvements and modifications to the preferred embodiments of the present disclosure. All such improvements and modifications are considered within the scope of the concepts disclosed herein and the claims that follow.

What is claimed is:

1. A LED chip comprising:
an active layer;
a substrate comprising a light-transmissive material with a light extraction face laterally bounded by a plurality of substrate sidewalls;
an anode and a cathode associated with the active layer;
an underfill material arranged on the plurality of substrate sidewalls; and
at least one lumiphoric material arranged on the light extraction face, wherein the at least one lumiphoric material is configured to receive at least a portion of light emitted by the active layer and responsively generate lumiphor emissions;
wherein each substrate sidewall of the plurality of substrate sidewalls comprises at least one of the following features (a) or (b):
(a) each substrate sidewall comprises a plurality of sidewall involutions that are substantially aligned in a direction generally parallel to a height direction of the substrate sidewall;
(b) each substrate sidewall comprises a plurality of non-coplanar surface portions that confer a sidewall surface area at least 30% greater than a comparable substrate sidewall of the same length and height dimensions but devoid of non-coplanar surface portions.

2. The LED chip of claim 1, wherein each substrate sidewall comprises an etched surface.

3. The LED chip of claim 1, wherein each substrate sidewall comprises a plurality of sidewall involutions that are substantially aligned in a direction generally parallel to a height direction of the substrate sidewall.

4. The LED chip of claim 3, wherein for each substrate sidewall of the plurality of substrate sidewalls, at least some sidewall involutions of the plurality of sidewall involutions extend at least 0.5 micrometer into the substrate sidewall in a direction perpendicular to a length of the substrate sidewall at a midpoint height of the substrate sidewall.

5. The LED chip of claim 3, wherein at least some sidewall involutions of the plurality of sidewall involutions are present in an amount of at least 2 involutions per micrometer of substrate sidewall length.

6. The LED chip of claim 1, wherein each substrate sidewall comprises a plurality of non-coplanar surface portions that confer a sidewall surface area at least 30% greater than a comparable substrate sidewall of the same length and height dimensions but devoid of non-coplanar surface portions.

7. The LED chip of claim 1, wherein each substrate sidewall comprises a plurality of non-coplanar surface portions that confer a sidewall surface area in a range of from 30% greater to 100% greater than a comparable substrate sidewall of the same length and height dimensions but devoid of non-coplanar surface portions.

8. The LED chip of claim 1, wherein the substrate comprises silicon carbide or sapphire.

9. The LED chip of claim 1, wherein the light extraction face comprises a non-repeating irregular textural pattern.

10. The LED chip of claim 1, wherein the substrate comprises a growth substrate on which the active layer was grown.

11. The LED chip of claim 1, wherein the anode and the cathode are substantially coplanar.

12. A pixelated-LED chip comprising:
an active layer comprising a plurality of active layer portions;
a substrate comprising a plurality of substrate portions supporting the plurality of active layer portions, wherein each substrate portion comprises a light-transmissive material with a light extraction face laterally bounded by a plurality of substrate sidewalls;
a plurality of anode-cathode pairs associated with the plurality of active layer portions;
an underfill material arranged on the plurality of substrate sidewalls; and
at least one lumiphoric material arranged on the light extraction face of each substrate portion, wherein the at least one lumiphoric material is configured to receive at least a portion of light emitted by the active layer portions and responsively generate lumiphor emissions;
wherein each active layer portion of the plurality of active layer portions is configured to illuminate a different substrate portion of the plurality of substrate portions and transmit light through the light extraction face of the substrate portion, such that the plurality of active layer portions and the plurality of discontinuous substrate portions form a plurality of pixels; and
wherein each substrate sidewall of the plurality of substrate sidewalls comprises at least one of the following features (a) or (b):
(a) each substrate sidewall comprises a plurality of sidewall involutions that are substantially aligned in a direction generally parallel to a height direction of the substrate sidewall;
(b) each substrate sidewall comprises a plurality of non-coplanar surface portions that confer a sidewall surface area at least 50% greater than a comparable substrate sidewall of the same length and height dimensions but devoid of non-coplanar surface portions.

13. The pixelated-LED chip of claim 12, wherein each substrate sidewall comprises an etched surface.

14. The pixelated-LED chip of claim 12, wherein each substrate sidewall comprises a plurality of sidewall involutions that are substantially aligned in a direction generally parallel to a height direction of the substrate sidewall.

15. The pixelated-LED chip of claim 14, wherein for each substrate sidewall of the plurality of substrate sidewalls, at least some sidewall involutions of the plurality of sidewall involutions extend at least 0.5 micrometer into the substrate sidewall in a direction perpendicular to a length of the substrate sidewall at a midpoint height of the substrate sidewall.

16. The pixelated-LED chip of claim 14, wherein at least some sidewall involutions of the plurality of sidewall involutions are present in an amount of at least 2 involutions per micrometer of substrate sidewall length.

17. The pixelated-LED chip of claim 12, wherein each substrate sidewall comprises a plurality of non-coplanar surface portions that confer a sidewall surface area at least 30% greater than a comparable substrate sidewall of the same length and height dimensions but devoid of non-coplanar surface portions.

18. The pixelated-LED chip of claim 12, wherein each substrate sidewall comprises a plurality of non-coplanar surface portions that confer a sidewall surface area in a range of from 30% greater to 100% greater than a comparable substrate sidewall of the same length and height dimensions but devoid of non-coplanar surface portions.

19. The pixelated-LED chip of claim 12, wherein the substrate comprises silicon carbide or sapphire.

20. The pixelated-LED chip of claim 12, wherein for each substrate portion of the plurality of substrate portions, wherein the light extraction face comprises a non-repeating irregular textural pattern.

21. The pixelated-LED chip of claim 12, wherein the substrate comprises a growth substrate on which the active layer was grown.

22. The pixelated-LED chip of claim 12, wherein each anode-cathode pair of the plurality of anode-cathode pairs is substantially coplanar.

* * * * *